United States Patent
Fukuda et al.

(10) Patent No.: US 8,926,863 B2
(45) Date of Patent: Jan. 6, 2015

(54) PROCESS FOR PRODUCING FLUORESCENT SUBSTANCE AND FLUORESCENT SUBSTANCE PRODUCED THEREBY

(75) Inventors: Yumi Fukuda, Tokyo (JP); Naotoshi Matsuda, Chigasaki (JP); Ryosuke Hiramatsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/216,860

(22) Filed: Aug. 24, 2011

(65) Prior Publication Data

US 2012/0037849 A1 Feb. 16, 2012

Related U.S. Application Data

(63) Continuation of application No. PCT/JP2009/065104, filed on Aug. 28, 2009.

(51) Int. Cl.
   C09K 11/06 (2006.01)
   C09K 11/77 (2006.01)
   H01L 33/50 (2010.01)

(52) U.S. Cl.
   CPC ........... *C09K 11/7734* (2013.01); *H01L 33/502* (2013.01)
   USPC .................................................. 252/301.4 F

(58) Field of Classification Search
   USPC ........ 252/301.6 R, 301.4 F, 301.6 F, 301.4 R; 313/467, 468, 483, 503; 257/89, 98
   See application file for complete search history.

(56) References Cited

U.S. PATENT DOCUMENTS

| | | | | |
|---|---|---|---|---|
| 8,303,847 | B2 * | 11/2012 | Gotoh et al. | 252/301.4 F |
| 2006/0197439 | A1 * | 9/2006 | Sakane et al. | 313/503 |
| 2007/0166218 | A1 * | 7/2007 | Hirosaki et al. | 423/325 |
| 2007/0259206 | A1 | 11/2007 | Oshio | |
| 2009/0166584 | A1 * | 7/2009 | Shimooka et al. | 252/301.4 F |
| 2009/0236963 | A1 * | 9/2009 | Nagatomi et al. | 313/483 |
| 2009/0284948 | A1 * | 11/2009 | Yamao et al. | 362/84 |

(Continued)

FOREIGN PATENT DOCUMENTS

| | | |
|---|---|---|
| JP | 2005-048105 | 2/2005 |
| JP | 2008-177592 | 7/2008 |

(Continued)

OTHER PUBLICATIONS

Fukuda et al, Luminescence Properties of Eu2+-Doped Green-Emitting Sr-Sialon Phosphor and Its Application to White Light-Emitting Diodes, Dec. 26, 2008, Applied Physics Express, vol. 2, pp. 012401-1 through 012401-3.*

(Continued)

*Primary Examiner* — Emily Le
*Assistant Examiner* — Lynne Edmondson
(74) *Attorney, Agent, or Firm* — Oblon, Spivak, McClelland, Maier & Neustadt, L.L.P.

(57) ABSTRACT

The present invention provides a fluorescent substance excellent both in quantum efficiency and in temperature characteristics, and also provides a process for producing the fluorescent substance. This fluorescent substance is an oxynitride phosphor having a low paramagnetic defect density and comprising aluminum, silicon, either or both of oxygen and nitrogen, and a metal element M, provided that the metal element M is partly replaced with an emission center element R. That phosphor can be produced by the steps of: subjecting a mixture of starting materials to heat treatment under a nitrogen atmosphere so as to obtain an intermediate fired product, and then further subjecting the intermediate fired product to heat treatment under an atmosphere of nitrogen-hydrogen mixed gas.

7 Claims, 15 Drawing Sheets

(56) References Cited

U.S. PATENT DOCUMENTS

| | | | |
|---|---|---|---|
| 2010/0025632 A1* | 2/2010 | Fukuda et al. | 252/301.6 R |
| 2010/0231121 A1* | 9/2010 | Kaneda et al. | 313/503 |

FOREIGN PATENT DOCUMENTS

| | | |
|---|---|---|
| JP | 2008-189811 | 8/2008 |
| JP | 2009-024030 | 2/2009 |
| WO | WO 2008041501 A1 * | 4/2008 |

OTHER PUBLICATIONS

English translation of the International Preliminary Report on Patentability and Written Opinion of the International Searching Authority issued Mar. 22, 2012, in PCT/JP2009/065104, filed Aug. 28, 2009.

U.S. Appl. No. 13/214,444, filed Aug. 22, 2011, Mitsuishi, et al.
U.S. Appl. No. 13/214,608, filed Aug. 22, 2011, Mitsuishi, et al.
U.S. Appl. No. 13/214,410, filed Aug. 22, 2011, Mitsuishi, et al.
U.S. Appl. No. 13/214,572, filed Aug. 22, 2011, Mitsuishi, et al.
U.S. Appl. No. 13/214,377, filed Aug. 22, 2011, Mitsuishi, et al.
U.S. Appl. No. 13/239,578, filed Sep. 22, 2011, Kato, et al.
Yumi Fukuda et al.; "Luminescence Properties of $Eu^{2+}$-Doped Green-Emitting Sr-Sialon Phosphor and Its Application to White Light-Emitting Diodes"; Applied Physics Express, 2009, vol. 2, pp. 012401-1-012401-3.
International Search Report issued Nov. 17, 2009 in PCT/JP2009/065104 filed Aug. 28, 2009.
U.S. Appl. No. 13/407,115, filed Feb. 28, 2012, Kato, et al.

* cited by examiner

PROCESS FOR PRODUCING FLUORESCENT SUBSTANCE AND FLUORESCENT SUBSTANCE PRODUCED THEREBY

TECHNICAL FIELD

The present invention relates to a process for producing a fluorescent substance used in a light-emitting device and also to the fluorescent substance produced thereby. Specifically, this invention relates to a fluorescent substance usable in a display, such as a field emission display, or in a light-emitting device comprising a blue or UV LED as a light source.

BACKGROUND ART

LED lamps, which utilize light-emitting diodes, are used in many displaying elements of instruments such as mobile devices, PC peripheral equipments, OA equipments, various kinds of switches, light sources for backlighting, and indicating boards. The LED lamps are strongly required not only to have high efficiencies, but also to be excellent in color rendition when used for general lighting or to deliver wide color gamuts when used for backlighting. In order to enhance the efficiencies, it is necessary to improve those of fluorescent substances used therein. On the other hand, for the purpose of realizing high color rendition or a wide color gamut, it is effective to adopt a fluorescent substance emitting green luminescence under excitation by blue light.

Meanwhile, high load LED lamps generate heat in operation so that fluorescent substances used therein are generally heated to about 100° C. to 200° C. When thus heated, the fluorescent substances generally lose emission intensity. Accordingly, it is desired that the fluorescent substances less undergo the decrease of emission intensity even if the temperature rises considerably.

From the above point of view, an Eu-activated β-SiAlON phosphor (for example, disclosed in Patent document 1) can be regarded as an example of the fluorescent substances which emit green luminescence under excitation by blue light and hence which are suitably used for the aforementioned LED lamps. This phosphor is said to be very efficient when excited at 450 nm, and specifically its absorption ratio, inner quantum efficiency and emission efficiency under the excitation at 450 nm are approx. 65%, 53% and 35%, respectively.

In the meantime, a lot of energetic work has recently been devoted to development of flat panel displays, and the development has put emphasis on the study of PDPs (plasma displays) and LCDs (liquid crystal displays). However, field emission displays are expected to give much clearer images and hence to be more advantageous than the PDPs and LCDs.

The field emission display comprises a screen on which red, green and blue fluorescent substances are arranged, and also comprises a cathode spaced apart from and facing to the screen. The space between the screen and the cathode is smaller than that in a CRT. The cathode includes plural emitter elements as electron sources, which emit electrons in accordance with potential difference between the emitter elements and gate electrodes placed nearby. The electrons thus emitted are accelerated by an anode voltage (accelerating voltage) applied on the fluorescent substance side, and then made to impinge against the fluorescent substances, so that the fluorescent substances give off luminescence to display a clear image.

As for the fluorescent substances used in the field emission display constituted as described above, it is required to have sufficiently high emission efficiency and to keep exhibiting the sufficiently high emission efficiency even when saturation is achieved by excitation with a high current density. In view of only this requirement, sulfide phosphors (e.g., ZnS:Cu, ZnS:Ag), which are conventionally used as fluorescent substances for CRTs, may be considered as prospective candidates for the fluorescent substances usable in the field emission display. However, the sulfide phosphors such as ZnS are reported to decompose under the condition where a low-energy cathode ray display screen is excited. This is a serious problem because the decomposed products thus generated badly degrade a heat filament, from which electron beams are emitted. Further, conventionally used ZnS-based blue fluorescent substances are more liable to deteriorate in luminance as compared with red and green fluorescent substances. This raises another problem in that colors in displayed color images fade or change gradually with time.

The present inventors researched a SiAlON oxy-nitride phosphor capable of emitting blue luminescence (Patent document 2). This fluorescent substance less undergoes the decrease of emission intensity even if the temperature rises, as compared with conventional blue light-emitting fluorescent substances. Even so, however, it is still desired to develop a fluorescent substance having characteristics better than that phosphor. In addition, with respect to the fluorescent substances emitting light of colors other than blue, it is desired to improve their deterioration over time.

PRIOR ART DOCUMENTS

Patent Documents

[Patent document 1] Japanese Patent Laid-Open No. 2005-255895

[Patent document 2] Japanese Patent Laid-Open No. 2006-335832

Non-Patent Documents

[Non-patent document 1] International Tables for Crystallography, Volume A: Space-group symmetry, edited by T. Hahn, published by Springer (Netherlands)

[Non-patent document 2] J. Grins, S. Esmaeilzadeh, G. Svensson, Z. J. Shen, *J. Euro. Cera. Soc.* 19, 2723 (1999)

DISCLOSURE OF INVENTION

Problem to be Solved by the Invention

In view of the above problems, objects of the present invention are to provide a process for producing a fluorescent substance excellent both in quantum efficiency and in temperature characteristics and also to provide the fluorescent substance produced thereby.

Means for Solving Problem

An aspect of the present invention resides in a process for producing an oxynitride phosphor comprising aluminum, silicon, either or both of oxygen and nitrogen, and a metal element M selected from the group consisting of IA group elements, IIA group elements, IIIA group elements other than aluminum, IIIB group elements, rare earth elements and IVA group elements other than silicon, provided that said metal element M is partly replaced with an emission center element R selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe; which comprises: a first firing step in which a mixture of starting materials is subjected to heat treatment under a nitrogen atmosphere, to obtain an intermediate fired product; and a second firing step in which said intermediate fired product is subjected to heat treatment under an atmosphere of nitrogen-hydrogen mixed gas containing hydrogen in an amount of 1% to 100% inclusive, to form the oxynitride phosphor.

Another aspect of the present invention resides in an oxynitride phosphor which comprises aluminum, silicon, either or both of oxygen and nitrogen, and a metal element M selected from the group consisting of IA group elements, IIA group elements, IIIA group elements other than aluminum, IIIB group elements, rare earth elements and IVA group elements other than silicon, provided that said metal element M is partly replaced with an emission center element R selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe; which has the same crystal structure as $Sr_3Si_{13}Al_3O_2N_{21}$; and whose paramagnetic defect density detected at g=2.002 in electron spin resonance measurement is less than $2\times10^{14}$ spins/g.

Effect of the Invention

The present invention provides phosphors having high quantum efficiencies and emitting luminescence with strong intensity. Those phosphors less undergo the decrease of emission intensity even if the temperature rises, and hence have very high practicability.

BEST MODE FOR CARRYING OUT THE INVENTION

Figure 1:
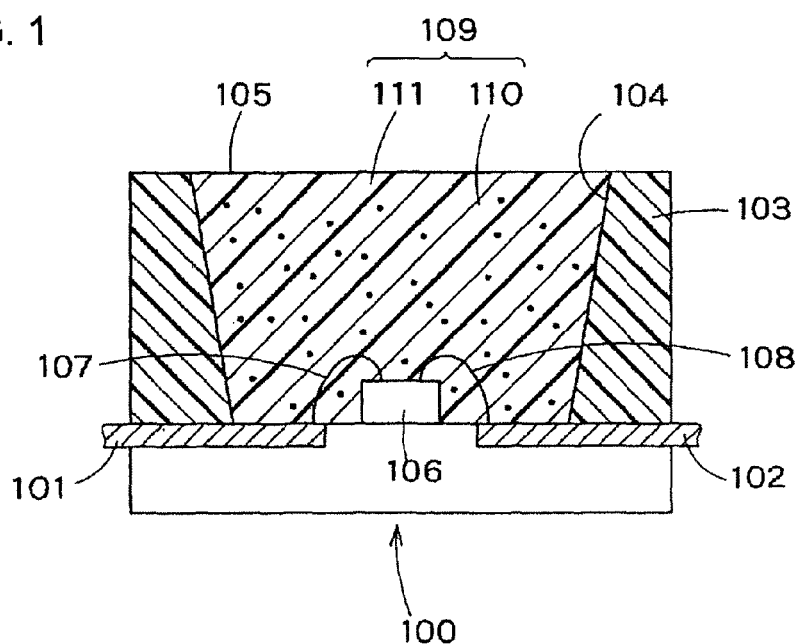
FIG. 1 is a schematic sectional view of a light-emitting device employing a fluorescent substance according to an embodiment of the present invention.

The present inventors have found that a fluorescent substance excellent both in quantum efficiency and in temperature characteristics can be obtained by incorporating an emission center element into an oxynitride compound having a particular crystal structure and a specific composition. The fluorescent substance according to the present invention is essentially based on an inorganic compound comprising aluminum, silicon, either or both of oxygen and nitrogen, and a metal element M selected from the group consisting of IA group elements, IIA group elements, IIIA group elements other than aluminum, IIIB group elements, rare earth elements and IVA group elements other than silicon. However, in the fluorescent substance of the present invention, the metal element M participating in the crystal structure of the basic inorganic compound is partly replaced with an emission center element R. The emission center element R is selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe. Since containing Si, Al, O and N, this kind of fluorescent substance is often referred to as "SiAlON phosphor".

The metal element M is preferably selected from the group consisting of: IA group elements such as Li, Na and K; IIA group elements such as Mg, Ca, Sr and Ba; IIIA group elements such as B, Ga and In; IIIB group elements such as Y and Sc; rare earth elements such as Gd, La and Lu; and IVA group elements such as Ge. The metal element M may be either a single element or a combination of two or more elements.

The fluorescent substance according to the present invention has a crystal structure basically comprising the elements of M, Al, Si and O and/or N, but it is necessary that the metal element M be partly replaced with an emission center element R.

The emission center element R can be freely selected from the above-described elements according to necessity, but at least one of Eu and Mn is preferred and Eu is particularly preferred in consideration of emission wavelength variability and the like.

Preferably, 0.1 mol % or more of the metal element M is replaced with the emission center element R. If the amount of the replaced M is less than 0.1 mol %, it is difficult to obtain sufficient emission intensity. The metal element M can be completely replaced with the emission center element R. However, if the amount of the replaced M is less than 50 mol %, the decrease of emission probability (concentration quenching) can be avoided to the utmost. The emission center element enables the fluorescent substance of the present invention to emit luminescence in various wavelength ranges depending on the crystal structure and the emission center element when the fluorescent substance is excited by light of 250 to 500 nm.

The fluorescent substance of the present invention is characterized by having a very low paramagnetic defect density. Specifically, it is a characteristic of the fluorescent substance according to the present invention that the paramagnetic defect density detected at g=2.002 in electron spin resonance (hereinafter, referred to as "ESR") measurement is less than $2 \times 10^{14}$ spins/g, preferably less than $5 \times 10^{13}$ spins/g. In general, paramagnetic defects tend to be readily formed in multi-component fluorescent substances such as SiAlON phosphors. When a SiAlON phosphor is formed, substitution occurs between N and O atoms or between Al and Si atoms but it often incompletely proceeds. This incomplete substitution is presumed to cause the paramagnetic defects. Accordingly, to date no one has succeeded in obtaining a SiAlON oxynitride phosphor having paramagnetic defects in as small an amount as the fluorescent substance defined in the present invention. In contrast, the SiAlON oxynitride phosphor of the present invention contains paramagnetic defects in a small amount, and this structural characteristic enables the phosphor to realize high emission efficiency.

The paramagnetic defect density can be measured by means of ESR. In the ESR measurement, a magnetic field is swept while the sample is being exposed to a microwave. When an unpaired electron is placed in the magnetic field, its energy level is split. The ESR is a spectroscopic analysis of measuring transition between those split levels. According as the magnetic field increases, the energy gap between the split levels also increases. When this gap matches the energy of the microwave, the microwave is observed to be absorbed. The ESR spectrum is normally expressed in the form of a differential curve, and hence a curve of absorption or signal strength thereof can be obtained by integrating the differential curve once or twice, respectively.

The fluorescent substance of the present invention, which has a low paramagnetic defect density, can be produced in any manner. For example, it can be obtained according to the below-described two-step firing process. On the other hand, however, it should be noted that the normal firing process, which has been conventionally adopted, increases paramagnetic defects, and accordingly it is difficult for the conventional production process to realize as low a paramagnetic defect density as the present invention.

One embodiment of the fluorescent substance according to the present invention is a green light-emitting phosphor which has the same crystal structure as $Sr_3Si_{13}Al_3O_2N_{21}$ and which emits light in the range of bluish green to yellowish green, namely, luminescence having a peak in the wavelength range of 490 to 580 nm under excitation by light of 250 to 500 nm. This fluorescent substance can be said to be a phosphor in which the constituting elements Sr, Si, Al, O and N are replaced with other elements and/or the matrix is fused with other metal elements such as Eu to form a solid solution. These modifications such as replacement change the lattice constants, and thereby the crystal structure is often slightly changed. However, the atomic positions therein, which depend on such conditions as the crystal structure, the sites occupied by the atoms therein and their atomic coordinates, are seldom changed so greatly that the chemical bonds among the skeleton atoms are broken. This means that the fluorescent substance of the present invention can give the effect of the present invention without changing the fundamental crystal structure. In the present invention, it is considered that the fundamental crystal structure is not changed as long as the modification is to the extent described below. In the case where the chemical bond lengths (close interatomic distances) of $M^1$-N and $M^2$-N calculated from the lattice constants and atomic coordinates determined by X-ray diffraction or neutron diffraction are within the range of ±15% based on those of Al—N and Si—N calculated from the lattice constants and atomic coordinates (shown in Table 1) of $Sr_3Si_{13}Al_3O_2N_{21}$, respectively, the fundamental crystal structure is thought not to be changed in the present invention. The green light-emitting fluorescent substance of the present invention has the above crystal structure. If the chemical bond lengths are changed more than the above, they are broken to form another crystal structure and hence the effect of the present invention may be impaired.

TABLE 1

| | Site | SOF* | x | y | z |
|---|---|---|---|---|---|
| Sr1 | 4a | 1 | 0.2500 | 0.0000 | 0.1238(9) |
| Sr2 | 4a | 1 | 0.7667(11) | 0.1679(10) | 0.1312(8) |
| Sr3 | 4a | 1 | 0.7667(11) | 0.1679(10) | 0.6312(8) |
| Si1 | 4a | 0.5 | 0.0857(6) | 0.5274(3) | 0.2435(3) |
| Si2 | 4a | 0.5 | 0.4143(6) | 0.4726(3) | 0.2435(3) |
| Si3 | 4a | 0.5 | 0.0667(7) | 0.4709(4) | 0.2788(4) |
| Si4 | 4a | 0.5 | 0.4333(7) | 0.5291(4) | 0.2788(4) |
| Si5 | 4a | 1 | 0.1015(3) | 0.4497(2) | 0.0665(2) |
| Si6 | 4a | 1 | 0.3985(3) | 0.5503(2) | 0.0665(2) |
| Si7 | 4a | 1 | 0.9397(3) | 0.3398(2) | 0.2221(2) |
| Si8 | 4a | 1 | 0.5603(3) | 0.6602(2) | 0.2221(2) |
| Si9 | 4a | 1 | 0.0866(3) | 0.1586(2) | 0.2440(2) |
| Si10 | 4a | 1 | 0.4134(3) | 0.8414(2) | 0.2440(2) |
| Si11 | 4a | 1 | 0.9007(3) | 0.1506(2) | 0.4277(2) |
| Si12 | 4a | 1 | 0.5993(3) | 0.8494(2) | 0.4277(2) |
| Si13 | 4a | 1 | 0.9038(3) | 0.3520(19) | 0.4313(2) |
| Si14 | 4a | 1 | 0.5962(3) | 0.6480(19) | 0.4313(2) |
| Si15 | 4a | 1 | 0.1025(3) | 0.0525(19) | 0.0691(2) |
| Si16 | 4a | 1 | 0.3975(3) | 0.9475(19) | 0.0691(2) |
| Si17 | 4a | 1 | 0.6052(3) | 0.2491(2) | 0.4346(2) |
| Si18 | 4a | 1 | 0.8948(3) | 0.7509(8) | 0.4346(2) |
| N1 | 4a | 1 | 0.9936(9) | 0.3559(8) | 0.3289(6) |
| N2 | 4a | 1 | 0.5064(9) | 0.6441(8) | 0.3289(6) |
| N3 | 4a | 1 | 0.2500 | 0.5000 | 0.2960(1) |
| N4 | 4a | 1 | 0.0171(10) | 0.4419(5) | 0.1733(6) |
| N5 | 4a | 1 | 0.4829(10) | 0.5581(5) | 0.1733(6) |
| N6 | 4a | 1 | 0.7456(8) | 0.6671(7) | 0.2049(6) |
| N7 | 4a | 1 | 0.7544(8) | 0.3329(7) | 0.2049(6) |
| N8 | 4a | 1 | 0.2110(2) | 0.5458(11) | 0.0630(1) |
| N9 | 4a | 1 | 0.4760(18) | 0.4535(14) | 0.0120(1) |
| N10 | 4a | 1 | 0.5322(19) | 0.5488(11) | 0.4870(1) |
| N11 | 4a | 1 | 0.5320(2) | 0.7498(14) | 0.4870(1) |
| N12 | 4a | 1 | 0.7943(18) | 0.2494(11) | 0.4400(1) |
| N13 | 4a | 1 | 0.4706(19) | 0.8488(11) | 0.0100(1) |
| N14 | 4a | 1 | 0.7901(18) | 0.8475(16) | 0.4500(1) |
| N15 | 4a | 1 | 0.5442(19) | 0.1508(12) | 0.4920(1) |
| N16 | 4a | 1 | 0.0407(11) | 0.0624(6) | 0.1785(6) |
| N17 | 4a | 1 | 0.4593(11) | 0.9376(6) | 0.1785(6) |
| N18 | 4a | 1 | 0.0514(12) | 0.6421(7) | 0.1812(7) |
| N19 | 4a | 1 | 0.0316(12) | 0.2506(7) | 0.1742(6) |
| N20 | 4a | 1 | 0.7881(19) | 0.6483(12) | 0.4380(1) |
| N21 | 4a | 1 | 0.7897(17) | 0.4504(10) | 0.4460(1) |
| N22 | 4a | 1 | 0.4486(12) | 0.3579(7) | 0.1812(7) |
| N23 | 4a | 1 | 0.4684(12) | 0.7494(7) | 0.1742(6) |

Remark)
SOF*: site occupation factor

The above green light-emitting fluorescent substance according to an embodiment of the present invention is represented by the following formula (1):

$$(M_{1-x1}R_{x1})_{3-y1}Si_{13-z}Al_{3+z}O_{2+u}N_{21-w} \quad (1).$$ 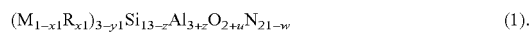

In the formula (1), M and R are the same as described above and x1, y1, z, u and w are numbers satisfying the conditions of $0<x1\leq1$, $-0.1\leq y1\leq0.15$, $-1\leq z\leq1$, and $-1\leq u-w\leq1$, respectively. These conditions are preferably $0.001\leq x1\leq0.5$, $-0.09\leq y1\leq0.07$, $0.2\leq z\leq1$ and $-0.1\leq u-w\leq0.3$, respectively.

The green light-emitting fluorescent substance according an embodiment of the present invention is based on an inorganic compound having essentially the same crystal structure as $Sr_3Si_{13}Al_3O_2N_{21}$ provided that the constituting elements thereof are partly replaced with luminous elements and that their contents are restricted in the predetermined ranges, whereby the fluorescent substance can have excellent quantum efficiency.

Figure 2:
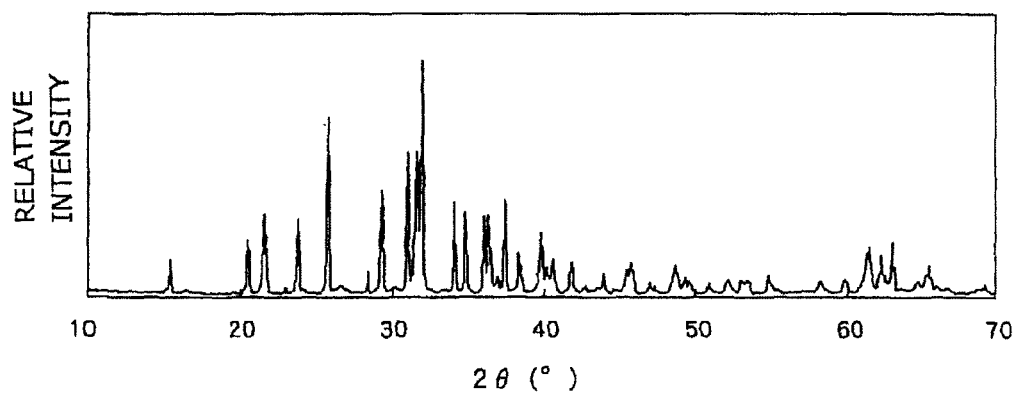
FIG. 2 is an XRD profile of a fluorescent substance having the $Sr_3Si_{13}Al_3O_2N_{21}$ crystal structure.
Figure 3A:
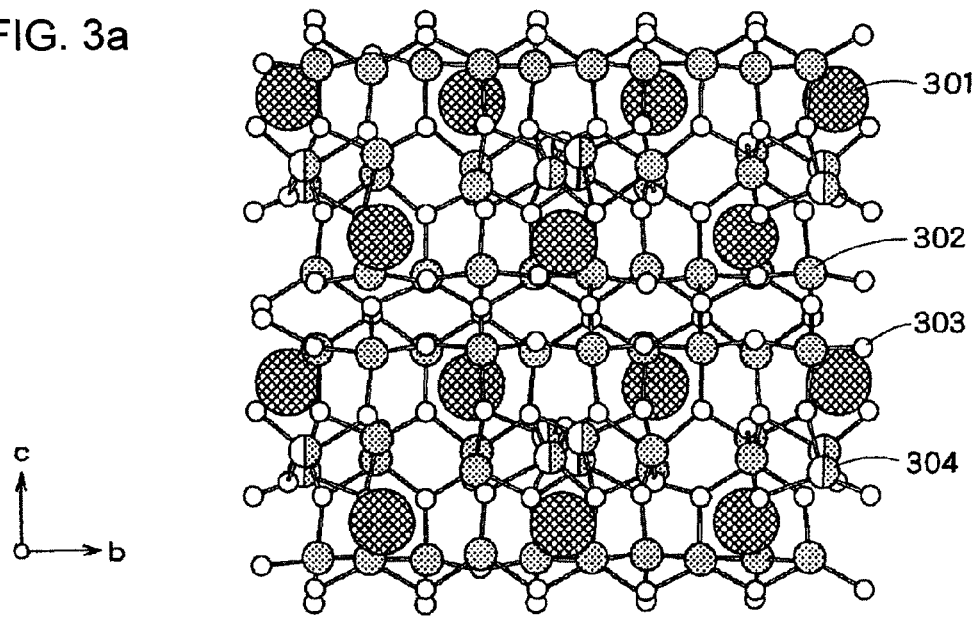
FIG. 3 illustrates the $Sr_3Si_{13}Al_3O_2N_{21}$ crystal structure. Figures (a) to (c) are projections thereof along the a, b and c axes, respectively.
Figure 3B:
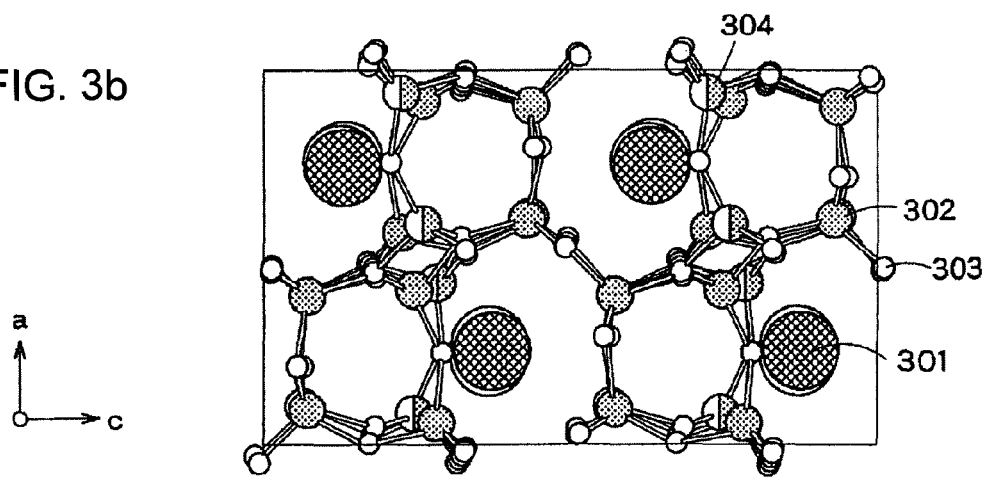
Figure 3C:
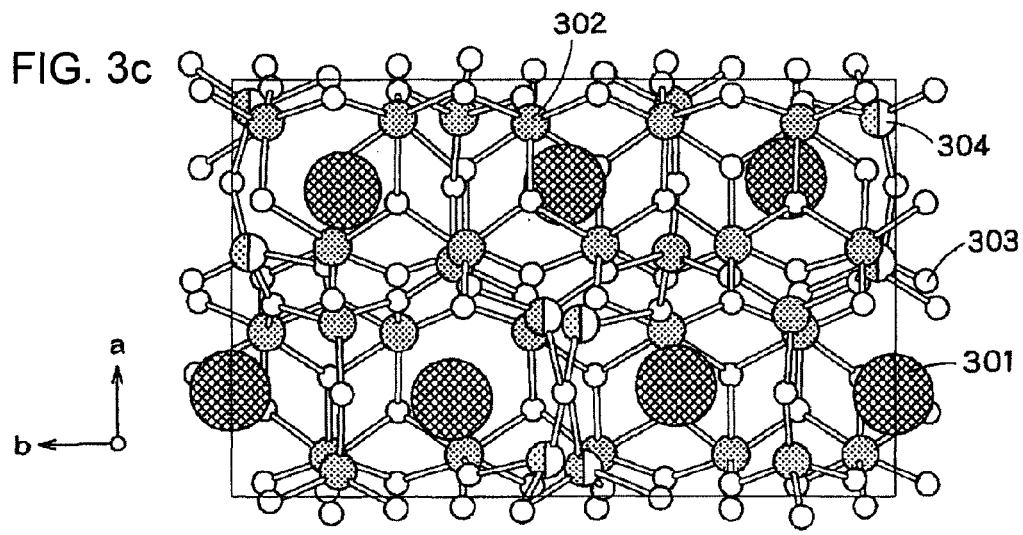

The crystal structure of $Sr_3Si_{13}Al_3O_2N_{21}$ belongs to an orthorhombic system with lattice constants of a=9.037(6) Å, b=14.734(9) Å and c=14.928(10) Å, and gives an XRD profile shown in FIG. 2. This crystal belongs to the space group $P2_12_12_1$ (which is the 19$^{th}$ space group listed in Non-patent document 1). In general, according to single crystal XRD, it can be determined what space group the crystal belongs to. The crystal structure of $Sr_3Al_3Si_{13}O_2N_{21}$ is illustrated in FIG. 3.

The green light-emitting fluorescent substance of the present invention can be identified by X-ray diffraction or neutron diffraction. The present invention includes not only a fluorescent substance exhibiting the same XRD profile as $Sr_3Si_{13}Al_3O_2N_{21}$, but also a compound in which the constituting elements thereof are replaced with other elements so as to change the lattice constants in the particular ranges. For example, the fluorescent substance according to the present invention includes a compound having the $Sr_3Si_{13}Al_3O_2N_{21}$ crystal in which Sr is replaced with the element M and/or the emission center element R; Si is replaced with one or more elements selected from the group of tetravalent elements such as Ge, Sn, Ti, Zr and Hf; Al is replaced with one or more elements selected from the group of trivalent elements such as B, Ga, In, Sc, Y, La, Gd and Lu; and O or N is replaced with one or more elements selected from the group consisting of O, N and C. Further, Al and Si may be substituted with each other and, at the same time, O and N may be substituted with each other. Examples of that compound include $Sr_3Si_{14}Al_2ON_{22}$, $Sr_3Si_{15}AlN_{23}$, $Sr_3Si_{12}Al_4O_3N_{20}$, $Sr_3Si_{11}Al_5O_4N_{19}$ and $Sr_3Si_{10}Al_6O_5N_{18}$. These compounds have crystal structures belonging to the same group as $Sr_3Si_{13}Al_3O_2N_{21}$.

In the case where the crystal is slightly fused, it can be judged whether or not the fused crystal belongs to the same group as $Sr_3Si_{13}Al_3O_2N_{21}$ by the following simple method. The XRD profile of the sample is measured, and the positions of the diffraction peaks are compared with those in the XRD profile of $Sr_3Si_{13}Al_3O_2N_{21}$. As a result, if the positions of the main peaks are identical, their crystal structures can be regarded as the same. As the main peaks for comparison, it is preferred to select about 10 peaks having strong diffraction intensity.

Another embodiment of the fluorescent substance according to the present invention is a red light-emitting phosphor which has the same crystal structure as $Sr_2Si_7Al_3ON_{13}$ and which emits luminescence having a peak in the wavelength range of 570 to 650 nm under excitation by light of 250 to 500 nm.

This red light-emitting fluorescent substance is based on $Sr_2Si_7Al_3ON_{13}$, but its constituting elements Sr, Si, Al, O and N are replaced with other elements and/or the matrix is fused with other metal elements such as Eu to form a solid solution. However, because of the same reason as described above for the green light-emitting fluorescent substance, it makes no matter that the crystal structure is slightly changed by those modifications such as replacement. Specifically, if the chemical bond lengths (close interatomic distances) of Al—N and Si—N calculated from the lattice constants and atomic coordinates determined by X-ray diffraction or neutron diffraction are within the range of ±15% based on those of Al—N and Si—N calculated from the lattice constants and atomic coordinates shown in Table 2 of $Sr_2Si_7Al_3ON_{13}$, respectively, the fundamental crystal structure is thought not to be changed in the present invention. The fluorescent substance of the present invention has the above crystal structure. If the chemical bond lengths are changed more than the above, they are broken to form another crystal structure and hence the effect of the present invention may be impaired.

TABLE 2

| | Site | SOF* | x | y | z |
|---|---|---|---|---|---|
| Sr1 | 4a | 1 | 0.2786 | 0.49060(11) | 0.5284(14) |
| Sr2 | 4a | 1 | 0.3552(3) | 0.69839(12) | 0.048(2) |
| Si/Al1 | 4a | 1 | 0.3582(9) | 0.2769(3) | 0.070(3) |
| Si/Al2 | 4a | 1 | 0.5782(9) | 0.7996(4) | 0.047(5) |
| Si/Al3 | 4a | 1 | 0.5563(8) | 0.4672(3) | 0.543(5) |
| Si/Al4 | 4a | 1 | 0.4724(8) | 0.6092(3) | 0.556(4) |
| Si/Al5 | 4a | 1 | 0.1910(7) | 0.6397(3) | 0.535(4) |
| Si/Al6 | 4a | 1 | 0.0061(8) | 0.5438(3) | 0.546(4) |
| Si/Al7 | 4a | 1 | 0.1625(9) | 0.5661(3) | 0.038(4) |
| Si/Al8 | 4a | 1 | 0.3937(8) | 0.3469(3) | 0.547(4) |
| Si/Al9 | 4a | 1 | 0.1552(18) | 0.3483(8) | 0.318(3) |
| Si/Al10 | 4a | 1 | 0.1525(14) | 0.3492(6) | 0.813(2) |
| O/N1 | 4a | 1 | 0.436(2) | 0.8164(10) | 0.061(11) |
| O/N2 | 4a | 1 | 0.699(2) | 0.4692(10) | 0.513(10) |
| O/N3 | 4a | 1 | 0.334(2) | 0.6355(10) | 0.511(9) |
| O/N4 | 4a | 1 | 0.213(2) | 0.2980(11) | 0.056(12) |
| O/N5 | 4a | 1 | 0.256(2) | 0.3750(10) | 0.563(9) |
| O/N6 | 4a | 1 | 0.894(2) | 0.6002(12) | 0.549(14) |
| O/N7 | 4a | 1 | 0.358(3) | 0.2062(12) | 0.893(6) |
| O/N8 | 4a | 1 | 0.508(2) | 0.4677(12) | 0.885(6) |
| O/N9 | 4a | 1 | 0.398(2) | 0.2727(12) | 0.392(6) |
| O/N10 | 4a | 1 | 0.430(3) | 0.3336(15) | 0.896(7) |
| O/N11 | 4a | 1 | 0.942(3) | 0.4614(15) | 0.371(8) |
| O/N12 | 4a | 1 | 0.662(2) | 0.8571(12) | 0.893(6) |
| O/N13 | 4a | 1 | 0.128(3) | 0.5743(15) | 0.381(7) |
| O/N14 | 4a | 1 | 0.495(3) | 0.3982(13) | 0.383(6) |

Remark)
SOF*: site occupation factor

The above red light-emitting fluorescent substance of the present invention is, for example, preferably represented by the following formula (2):

$$(M_{1-x2}R_{x2})_a Si_b AlO_c N_d \quad (2)$$

In the formula (1), M and R are the same as described above and x2, a, b, c and d are numbers satisfying the conditions of $0<x2<0.4$, $0.65<a<0.70$, $2<b<3$, $0.3<c<0.6$ and $4<d<5$, respectively. These conditions are preferably $0.02 \leq x2 \leq 0.2$, $0.66 \leq a \leq 0.69$, $2.2 \leq b \leq 2.4$, $0.43 \leq c \leq 0.51$ and $4.2 \leq d \leq 4.3$, respectively.

The red light-emitting fluorescent substance according an embodiment of the present invention is based on an inorganic compound having essentially the same crystal structure as $Sr_2Si_7Al_3ON_{13}$ provided that the constituting elements are partly replaced with luminous elements and that their contents are restricted in the predetermined ranges, whereby the fluorescent substance has excellent quantum efficiency and such favorable temperature characteristics that it less undergoes the temperature quenching when used in a light-emitting device.

Figure 4:
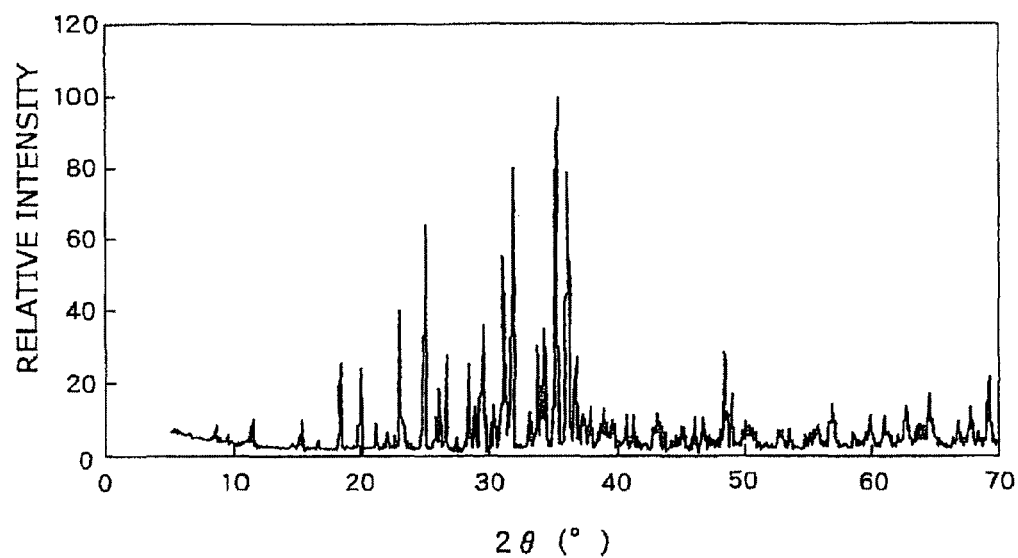
FIG. 4 is an XRD profile of a fluorescent substance having the $Sr_2Si_7Al_3ON_{13}$ crystal structure.
Figure 5A:
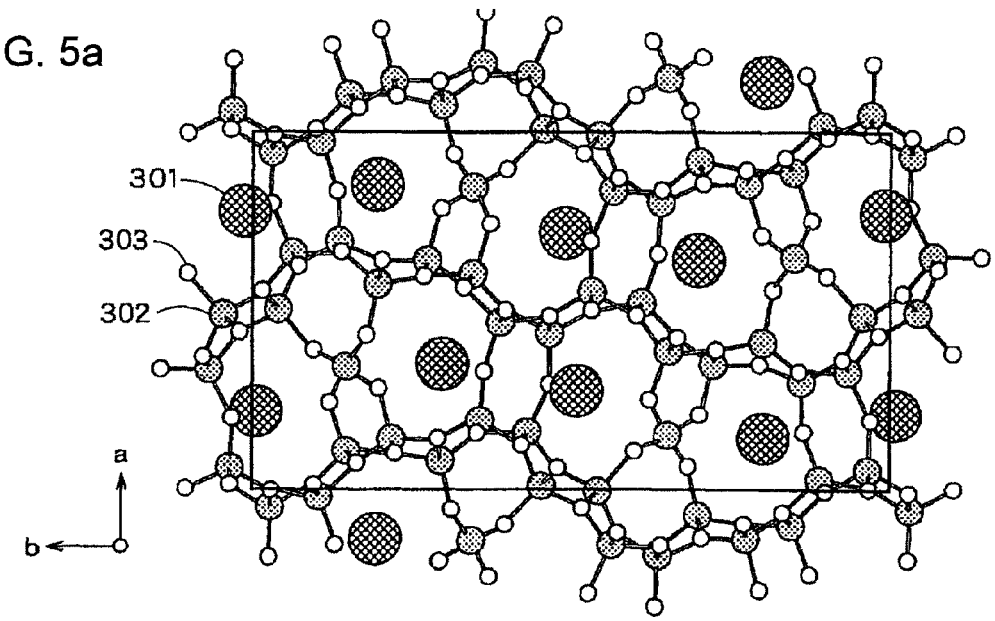
FIG. 5 illustrates the $Sr_2Si_7Al_3ON_{13}$ crystal structure. Figures (a) to (c) are projections thereof along the a, b and c axes, respectively.
Figure 5B:
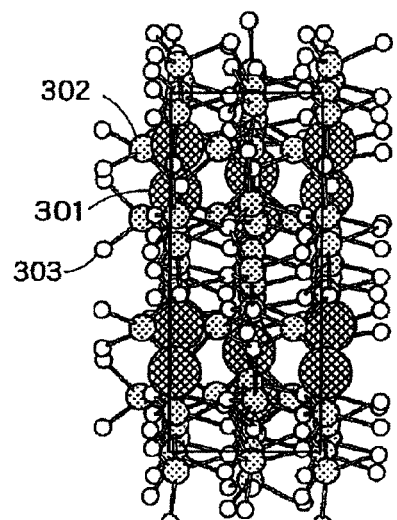
Figure 5C:
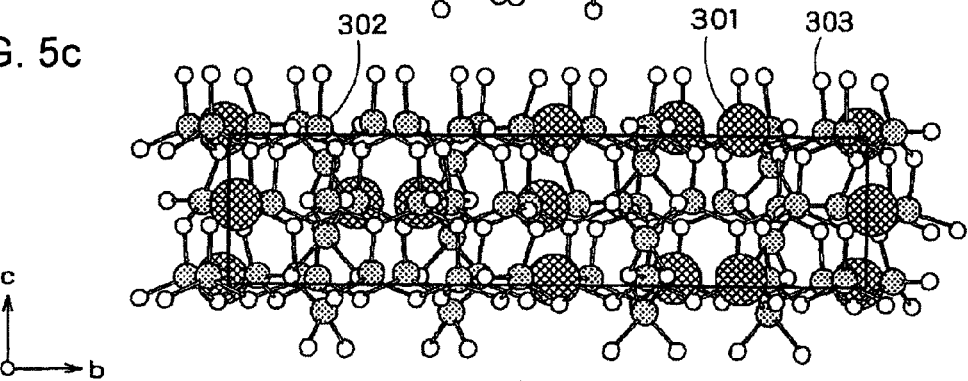

The crystal structure of $Sr_2Al_3Si_7ON_{13}$ belongs to an orthorhombic system with lattice constants of a=11.8033(13) Å, b=21.589(2) Å and c=5.0131(6) Å, and gives an XRD profile shown in FIG. 4. This crystal belongs to the space group Pna21 (which is the 164$^{th}$ space group listed in Non-patent document 1). In general, according to single crystal XRD, it can be determined what space group the crystal belongs to. The crystal structure of $Sr_2Si_7Al_3ON_{13}$ is illustrated in FIG. 5.

The fluorescent substance of the present invention can be identified by X-ray diffraction or neutron diffraction. The present invention includes not only a fluorescent substance exhibiting the same XRD profile as $Sr_2Si_7Al_3ON_{13}$, but also a compound in which the constituting elements thereof are replaced with other elements so as to change the lattice constants in the particular ranges. For example, the fluorescent substance according to the present invention includes a compound having the $Sr_2Si_7Al_3ON_{13}$ crystal in which Sr is replaced with the element M and/or the emission center element R; Si is replaced with one or more elements selected from the group of tetravalent elements such as Ge, Sn, Ti, Zr and Hf; Al is replaced with one or more elements selected from the group of trivalent elements such as B, Ga, In, Sc, Y, La, Gd and Lu; and O or N is replaced with one or more elements selected from the group consisting of O, N and C. Further, Al and Si may be substituted with each other and, at the same time, O and N may be substituted with each other. Examples of that compound include $Sr_2Si_8Al_2ON_{14}$, $Sr_2Si_6Al_4O_2N_{12}$, $Sr_2Si_5Al_5O_3N_{11}$ and $Sr_2Si_4Al_6O_4N_{10}$. These compounds have crystal structures belonging to the same group as $Sr_2Si_7Al_3ON_{13}$.

In the case where the crystal is slightly fused, it can be also judged according to the positions of diffraction peaks of the XRD profile in the same manner as described above for the green light-emitting fluorescent substance whether or not the fused crystal has a crystal structure belonging to the same group as the $Sr_2Si_7Al_3ON_{13}$-type crystal.

Still another embodiment of the fluorescent substance according to the present invention is a SiAlON phosphor which comprises a matrix represented by the following formula (3a) and which emits luminescence having a peak in the wavelength range of 400 to 700 nm under excitation by electron energy or by light in the wavelength range of 250 to 500 nm.

$$M'Si_{10-p}Al_{18+p}O_pN_{32-p} \quad (3a)$$

(In the formula (3a), M' is a metal element selected from the group consisting of IIA group metals and rare earth metals, and p is a number satisfying the condition of 0<p≤10.) Examples of the IIA group metals usable as M' include Ba, Ca, Sr and Mg, and those may be used singly or in combination of two or more. Examples of the rare earth metals usable as M' include Y, Gd and La, and those may be used singly or in combination of two or more. Further, the IIA group metals can be used in combination with the rare earth metals.

The fluorescent substance according the embodiment of the present invention can be regarded, for example, as a compound having the above formula (3a) in which the M' element is at least partly replaced with a luminous element. That fluorescent substance can be represented by the following formula (3):

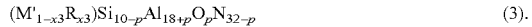

$$(M'_{1-x3}R_{x3})Si_{10-p}Al_{18+p}O_pN_{32-p} \quad (3).$$

(In the formula (3), M' is an element selected from the group consisting of IIA group metals and rare earth metals, R is an emission center element; and p and y are numbers satisfying the conditions of 0<p≤10 and 0<x3≤1, respectively.)

Preferably, 0.1 mol % or more of the metal element M' is replaced with the emission center element. If the replaced amount is less than 0.1 mol %, it is difficult to obtain sufficient emission intensity. On the other hand, 100% of the IIA group metal element M' may be replaced with the emission center element. In that case, the efficiency is particularly enhanced.

In the present invention, the above oxynitride phosphor, which has an AlN polytypoid structure, preferably contains oxygen in an amount of 0.3 to 30 wt %. Since oxides become liquid at a high temperature, the liquefied oxides promote synthesis reactions when the fluorescent substance is produced. However, if the content of oxygen is less than 0.3 wt %, the reactivity is so reduced that the reactions are hard to proceed favorably. On the other hand, however, if the fluorescent substance contains oxygen as much as more than 30 wt %, there is fear that the polytypoid structure can be no longer obtained.

Figure 6:
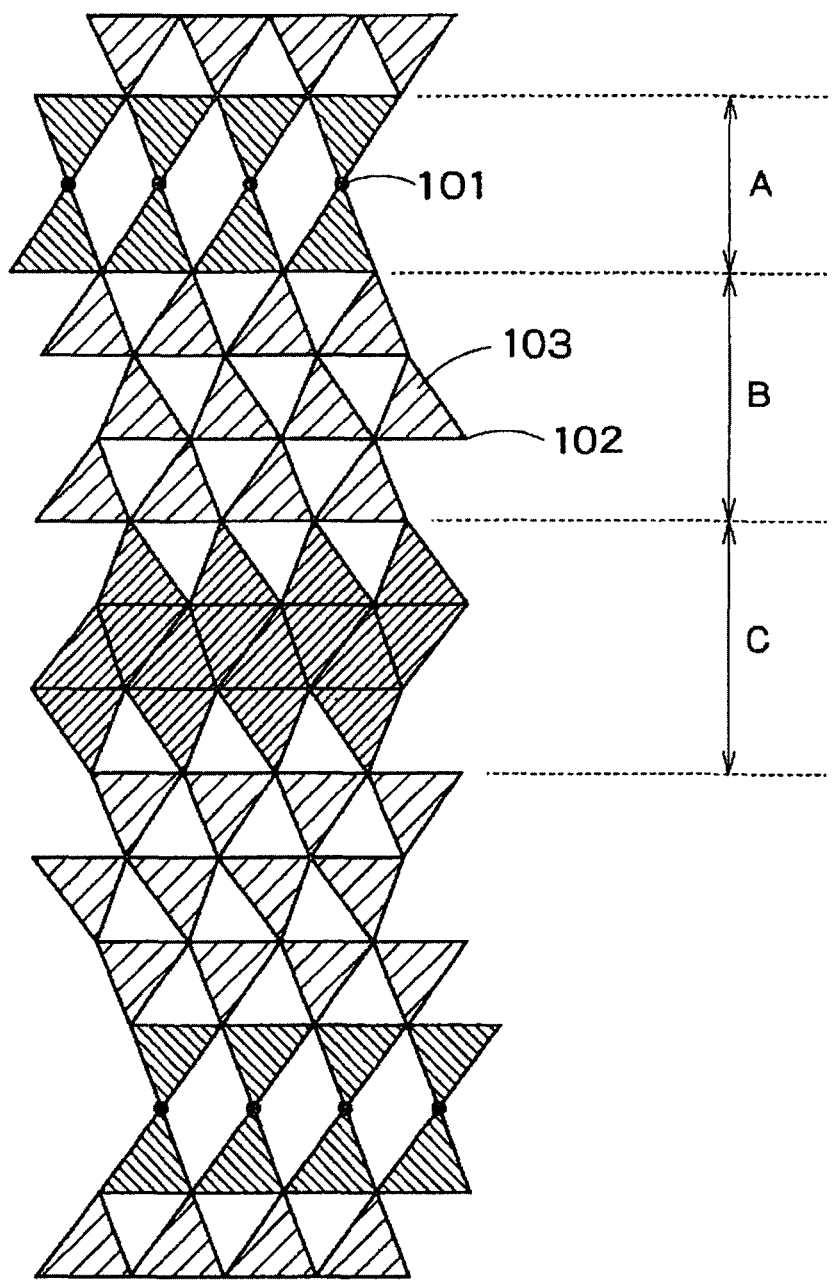
FIG. 6 schematically illustrates the $(M'_{1-x3}R_{x3})Si_{10-p}Al_{18+p}O_pN_{32-p}$ crystal structure.
Figure 7:
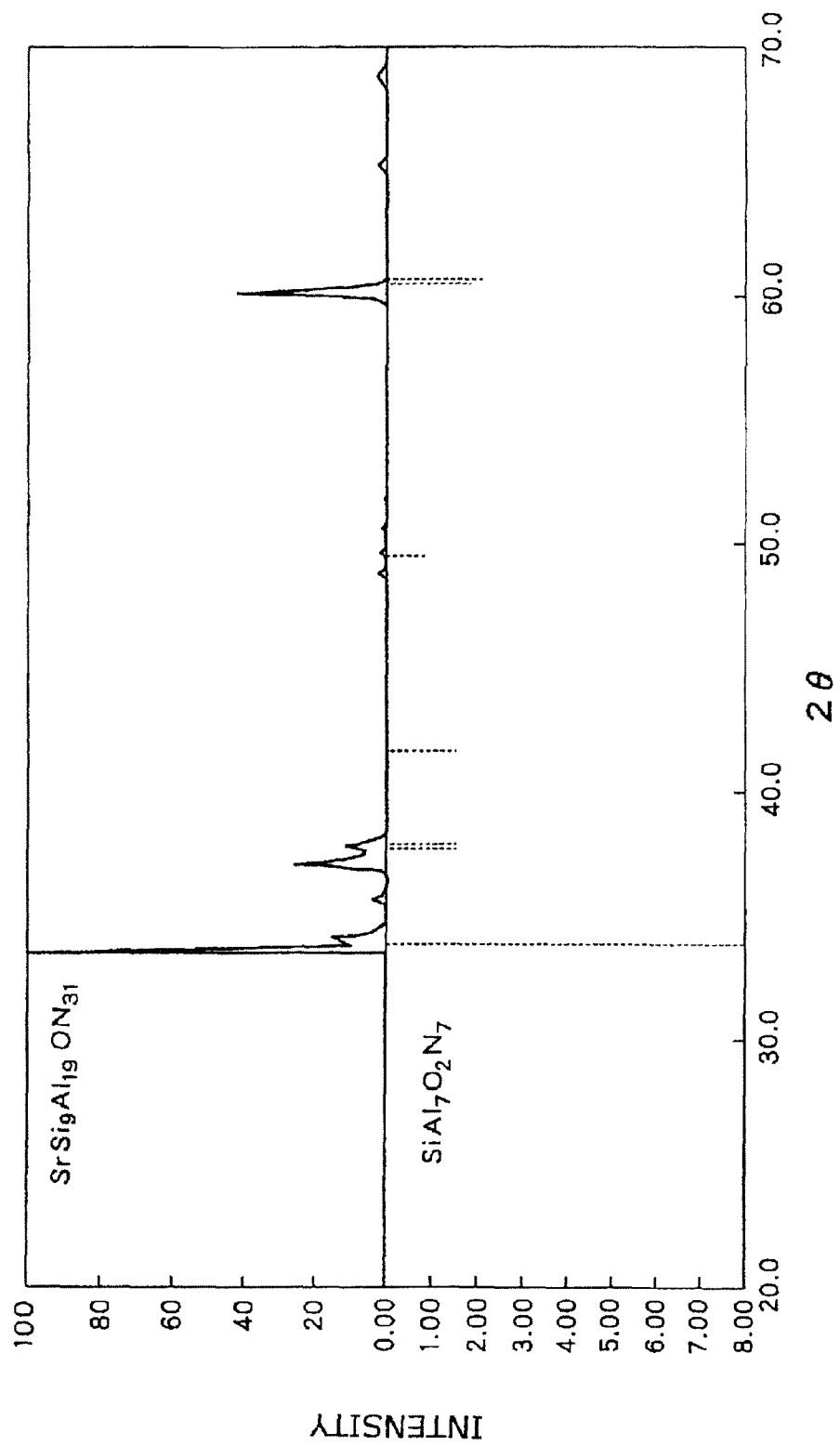
FIG. 7 is an XRD profile of a fluorescent substance having the $Sr_2Si_9Al_{19}ON_{31}$ crystal structure.

FIG. 6 schematically illustrates the structure of the fluorescent substance represented by the above formula (3) (see, Non-patent document 2). In FIG. 6, each triangle represents a regular tetrahedron structure in which the elements 103 and 102 are positioned at the center of gravity and at each vertex, respectively. The element 103 is Al or Si, and the element 102 is N or O. At the point indicated by the reference numeral 101, the IIA group metal element M' is positioned. As illustrated in the figure, the fluorescent substance represented by the above formula (3) has a structure consisting of four layers A, B, C and D. The layer A is made up of 12-coordinated M' center atoms, the layer B is composed of vertex-sharing regular tetrahedrons, the layer C is constituted of face-sharing regular tetrahedrons, and the layer D is composed of vertex-sharing regular tetrahedrons. FIG. 6 by no means restricts the number of regular tetrahedron structure-layers included in each of the layers A, B, C and D, and the number of tetrahedron structure-layers may be different from that shown in the figure. To sum up, the fluorescent substance of the formula (3) has a structure in which layers of $SiN_4$ structures and of M'-centered tetradecahedron structures are inserted periodically (intermittently) at the position 101 into a wurtzite structure comprising vertex-sharing $AlN_4$ regular tetrahedron structures.

When the temperature rises, fluorescent substances generally lose the emission efficiencies (temperature quenching). However, the fluorescent substance according to the embodiment of the present invention less undergoes the decrease of emission efficiency even if the temperature rises, and is characterized by having a high quenching temperature. The factors in causing the temperature quenching are, for example, crystal lattice stability of the phosphor matrix and size difference between the emission center ion and the phosphor matrix ion replaced therewith. The SiAlON oxynitride phosphor according to the embodiment of the present invention is presumed to have a high quenching temperature because of the above-described crystal structure and low paramagnetic defect density.

With respect to the above characteristics, the consideration of the inventors is as follows. That is, for example, in the case of a nitride phosphor having a basic skeleton of $AlN_4$ or $SiN_4$ regular tetrahedron structures as shown in FIG. 6, the crystal structure becomes more rigid and stable according as the shared vertices increases in the regular tetrahedron structures. The phosphor shown in FIG. 6 contains 2 to 6 shared vertices, and in the unit cell there are 4 positions where the vertex is shared by two tetrahedrons, about 60 positions where the vertex is shared by four tetrahedrons and about 24 positions where the vertex is shared by six tetrahedrons. In contrast, $Ca_2Si_5N_8$:Eu phosphor, which is known to emit red luminescence under excitation by blue light and which also has a basic skeleton of $SiN_4$ regular tetrahedron structures, contains 2 to 3 shared vertices on average. Accordingly, since containing more shared vertices than conventional phosphors, the fluorescent substance according to the embodiment of the present invention is presumed to have a more stable crystal lattice. In addition, the fluorescent substance contains emission centers in two-dimensional layer structures and has tetradecahedral coordination structures, and those also contribute towards stability around the emission centers. The above structural characteristics are considered to elevate the quenching temperature of the fluorescent substance according to the embodiment of the present invention.

The process of the present invention for producing an oxynitride phosphor is for the purpose of manufacturing an oxynitride phosphor having the aforementioned composition and crystal structure. The oxynitride phosphor aimed at in the present invention can be synthesized from starting materials, which are, for example, a nitride of the element M or a carbide thereof such as cyanamide; nitrides, oxides or carbides of Al and Si; and an oxide, nitride or carbonate of the emission center element R. In the case where Sr as the element M and Eu as the emission center element R are intended to be incorporated, it is possible to adopt $Sr_3N_2$, AlN, $Si_3N_4$, $Al_2O_3$ and EuN as the starting materials. It is also possible to use $Ca_3N_2$, $Ba_3N_2$, $Sr_2N$, SrN, $SrCO_3$ or mixtures thereof in place of $Sr_3N_2$. These materials are weighed out and mixed so that the aimed composition can be obtained, to prepare a mixture of starting materials. In this procedure, the materials are mixed, for example, in a mortar in a glove box. There is no particular restriction on the container in which the materials are mixed, and an agate mortar is generally used, for example. The materials may be mixed in a proper medium such as dehydrated iso-propanol, ethanol or water by means of a ball mill. The mixing time is not particularly restricted, and is, for example, 2 to 72 hours. If the materials are mixed in a solvent, the solvent is generally removed by evaporation before firing.

After dried and/or pulverized, if necessary, the mixture of starting materials is placed in a proper container and then fired under a nitrogen atmosphere to produce an intermediate fired product. Hereinafter, this firing procedure is referred to as "first firing step". In order to prevent the starting materials such as aluminum nitride from being oxidized too much, the first firing step is carried out under a nitrogen atmosphere. Specifically, for example, after the mixture of starting materials is set in a furnace, the pressure in the furnace is reduced and then nitrogen is introduced therein, so that gas in the furnace is replaced with nitrogen. The mixture of starting materials may be beforehand encased in a container, and the container may be covered with a lid by which powdery substances or the like other than gases are kept from coming in and out. It is preferred for the lid not to seal and make the container airtight. The lid restricts the flow of gases coming into or escaping from the container, and thereby is capable of, for example, preventing the inner pressure of the container from increasing unnecessarily.

The firing treatment in the first firing step is carried out generally at 1500 to 2000° C., preferably at 1800 to 2000° C. If the temperature is less than 1500° C., it is often difficult to obtain the aimed fluorescent substance. On the other hand, if the temperature is more than 2000° C., there is a fear that the materials or the product may be sublimated. The firing time is generally 0.5 to 10 hours, preferably 2 to 6 hours. The pressure of the nitrogen atmosphere is preferably the atmospheric pressure or more, further preferably 5 atm or more. This is because the firing under high pressure can prevent silicon nitride or the like from decomposing at a high temperature.

After the first firing step, the obtained inter-mediate fired product is further subjected to a second firing step. The second firing step is carried out under an atmosphere of nitrogen-hydrogen mixed gas. This means that the second firing step is performed under a reductive atmosphere. The nitrogen-hydrogen mixed gas contains hydrogen in an amount of necessarily 1% to 100% inclusive, preferably 30% to 90% inclusive.

The firing treatment in the second firing step is carried out generally at 1000 to 1900° C., preferably at 1400 to 1800° C. The temperature of the second firing step is preferably lower than that of the first firing step. Such temperature gives favorable emission characteristics to the fluorescent substance without drastically changing the crystal structure thereof. The firing time is generally 0.1 to 20 hours, preferably 0.5 to 12 hours.

The second firing step is thus performed under a hydrogen-containing atmosphere, whereby the fluorescent substance is improved in characteristics such as emission intensity. This is presumed to be because crystal defects of the oxynitride phosphor are decreased. The process of the present invention enables to obtain a fluorescent substance very different in characteristics from known fluorescent substances produced by firing under a conventional inert atmosphere.

In the second firing step, the intermediate fired product is preferably encased in a covered receptacle and then subjected to the firing treatment. Specifically, after the first firing step, the obtained intermediate fired product is pulverized and placed in a receptacle equipped with a lid. Successively, the lidded receptacle holding the intermediate fired product is further encased in an outer container equipped with inside and outside lids, and then the outer container is set in a furnace. Thereafter, the pressure in the receptacle is reduced and then the nitrogen-hydrogen mixed gas is introduced therein to replace gas in the receptacle. The firing treatment of the second firing step is preferably carried out after those procedures. The above "receptacle equipped with a lid" is, for example, a normal crucible. Accordingly, the term "covered receptacle" in the present invention does not mean an airtight receptacle. The lid allows gases to come into or escape from the receptacle, so as to prevent the inner pressure of the receptacle from increasing unnecessarily. At the same time, the lid also restricts the amount of hydrogen or nitrogen reacting with the materials, so as to form an oxynitride phosphor having a proper composition.

There is no particular restriction on the container or receptacle in which the mixture of starting materials or intermediate fired product is placed. As the receptacle equipped with a lid, a crucible can be used. The body and lid of the crucible, and the body, inside and outside lids of the outer container are made of, for example, boron nitride, silicon nitride, silicon carbide, carbon, aluminum nitride, SiAlON, aluminum oxide, molybdenum or tungsten.

The fired product in the form of powder is then subjected to after-treatment such as washing, if necessary, to obtain a fluorescent substance according to an embodiment of the present invention. The washing can be carried out, for example, by use of pure water or acid.

The fluorescent substance produced by the process of the present invention can be utilized in a white LED as well as a green, red or blue LED. In order to obtain white emission, the above fluorescent substance is used in combination with two or more fluorescent substances emitting luminescence in other wavelength ranges. For example, plural fluorescent substances emitting red, yellow (or green) and blue luminescence under excitation by ultraviolet light can be employed in combination. Further, the fluorescent substance according to the present invention can be combined with a fluorescent substance emitting yellow light when excited by blue light and, if necessary, also combined with a fluorescent substance emitting red light. When excited by blue light, the fluorescent substances thus combined can give white emission, which is a mixture of the luminescence and the excitation blue light.

The fluorescent substance according to the present invention can be used in any conventionally known light-emitting device. FIG. 1 is a schematic sectional view of a light-emitting device employing a fluorescent substance according to an embodiment of the present invention. This device comprises a light-emitting element giving off light in the wavelength range of 250 nm to 500 nm and a phosphor layer provided thereon, and the phosphor layer contains a fluorescent substance according to an embodiment of the present invention.

In the light-emitting device shown in FIG. 1, a resin system 100 comprises leads 101 and 102 molded as parts of a lead frame and also a resin member 103 formed by unified molding together with the lead frame. The resin member 103 gives a concavity 105 in which the top opening is larger than the bottom. On the inside wall of the concavity, a reflective surface 104 is provided.

At the center of the nearly circular bottom of the concavity 105, a light-emitting chip 106 is mounted with Ag paste or the like. Examples of the light-emitting chip 106 include a light-emitting diode and a laser diode. The light-emitting chip may radiate UV light. There is no particular restriction on the light-emitting chip. Accordingly, it is also possible to adopt a chip capable of emitting blue, bluish violet or near UV light as well as UV light. For example, a semi-conductor light-emitting element such as a GaN-type one can be used as the light-emitting chip. The electrodes (not shown) of the light-emitting chip 106 are connected to the leads 101 and 102 by way of bonding wires 107 and 108 made of Au or the like, respectively. The positions of the leads 101 and 102 can be adequately modified.

In the concavity 105 of the resin member 103, a phosphor layer 109 is provided. For forming the phosphor layer 109, for example, a fluorescent substance 110 according to an embodiment of the present invention is dispersed or precipitated in an amount of 5 to 50 wt % in a resin layer 111 made of silicone resin or the like. The fluorescent substance of the present invention comprises an oxynitride matrix having high covalency, and hence is generally so hydrophobic that it has good compatibility with the resin. Accordingly, scattering at the interface between the resin and the fluorescent substance is prevented enough to improve the light-extraction efficiency The light-emitting chip 106 may be of a flip chip type in which n-type and p-type electrodes are placed on the same plane. This chip can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to employ an n-type substrate in the light-emitting chip 106 so as to produce a light-emitting device constituted as described below. In that device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting chip 106 and the dimension and shape of the concavity 105 can be properly changed.

The light-emitting device according to an embodiment of the present invention is not restricted to the package cup-type shown in FIG. 1, and can be freely applied to any type of devices. For example, even if the fluorescent substance of the present invention is used in a shell-type or surface-mount type LED, the same effect can be obtained.

The present invention is further explained by the following examples, which by no means restrict the invention.

Example 1

As the starting materials, $Sr_3N_2$, EuN, $Si_3N_4$, $Al_2O_3$ and AlN in the amounts of 2.500 g, 0.647 g, 5.987 g, 0.748 g and 0.710 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize an intermediate fired product whose designed composition was $(Sr_{0.87}Eu_{0.13})_3Si_{12.8}Al_{3.2}O_{2.2}N_{20.8}$. The obtained intermediate fired product was in the form of yellowish green powder, and was itself such a fluorescent substance as was observed to emit green luminescence when excited by black light.

The intermediate fired product was then placed in a boron nitride-made crucible, namely, a receptacle equipped with a lid, and thereafter the receptacle equipped with a lid was encased in a larger boron nitride-made crucible, namely, an outer container. After the lid was put on the receptacle, the intermediate fired product was fired at 1500° C. for 12 hours under 1 atm of $N_2/H_2$ atmosphere to obtain a fluorescent substance. The outer container used here was equipped with inside and outside lids.

Example 2

As the starting materials, $Sr_3N_2$, EuN, $Si_3N_4$, $Al_2O_3$ and AlN in the amounts of 2.356 g, 0.896 g, 5.987 g, 0.748 g and 0.710 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize an intermediate fired product whose designed composition was $(Sr_{0.82}Eu_{0.18})_3Si_{12.8}Al_{3.2}O_{2.2}N_{20.8}$. The obtained intermediate fired product was in the form of yellowish green powder, and was observed to emit green luminescence when excited by black light.

The obtained intermediate fired product was placed in the same receptacle and container as in Example 1, and then fired at 1500° C. for 12 hours under 1 atm of $N_2/H_2$ atmosphere to obtain a fluorescent substance.

Example 3

As the starting materials, $Sr_3N_2$, EuN, $Si_3N_4$, $Al_2O_3$ and AlN in the amounts of 2.155 g, 1.244 g, 5.987 g, 0.748 g and 0.710 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize an intermediate fired product whose designed composition was $(Sr_{0.75}Eu_{0.25})_3Si_{12.8}Al_{3.2}O_{2.2}N_{20.8}$. The obtained intermediate fired product was in the form of yellowish green powder, and was observed to emit green luminescence when excited by black light.

The obtained intermediate fired product was placed in the same receptacle and container as in Example 1, and then fired at 1500° C. for 12 hours under 1 atm of $N_2/H_2$ atmosphere to obtain a fluorescent substance.

Comparative Example 1

As the starting materials, $Sr_3N_2$, EuN, $Si_3N_4$, $Al_2O_3$ and AlN in the amounts of 2.500 g, 0.647 g, 5.987 g, 0.748 g and 0.710 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Sr_{0.87}Eu_{0.13})_3Si_{12.8}Al_{3.2}O_{2.2}N_{20.8}$. The fluorescent substance after the firing procedure was in the form of yellowish green powder, and was observed to emit green luminescence when excited by black light.

Comparative Example 2

As the starting materials, $Sr_3N_2$, EuN, $Si_3N_4$, $Al_2O_3$ and AlN in the amounts of 2.356 g, 0.896 g, 5.987 g, 0.748 g and 0.710 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Sr_{0.82}Eu_{0.18})_3Si_{12.8}Al_{3.2}O_{2.2}N_{20.8}$. The fluorescent substance after the firing procedure was in the form of yellowish green powder, and was observed to emit green luminescence when excited by black light.

Comparative Example 3

As the starting materials, $Sr_3N_2$, EuN, $Si_3N_4$, $Al_2O_3$ and AlN in the amounts of 2.155 g, 1.244 g, 5.987 g, 0.748 g and 0.710 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Sr_{0.75}Eu_{0.25})_3Si_{12.8}Al_{3.2}O_{2.2}N_{20.8}$. The fluorescent substance after the firing procedure was in the form of yellowish green powder, and was observed to emit green luminescence when excited by black light.

Evaluation of Fluorescent Substances

Figure 8:
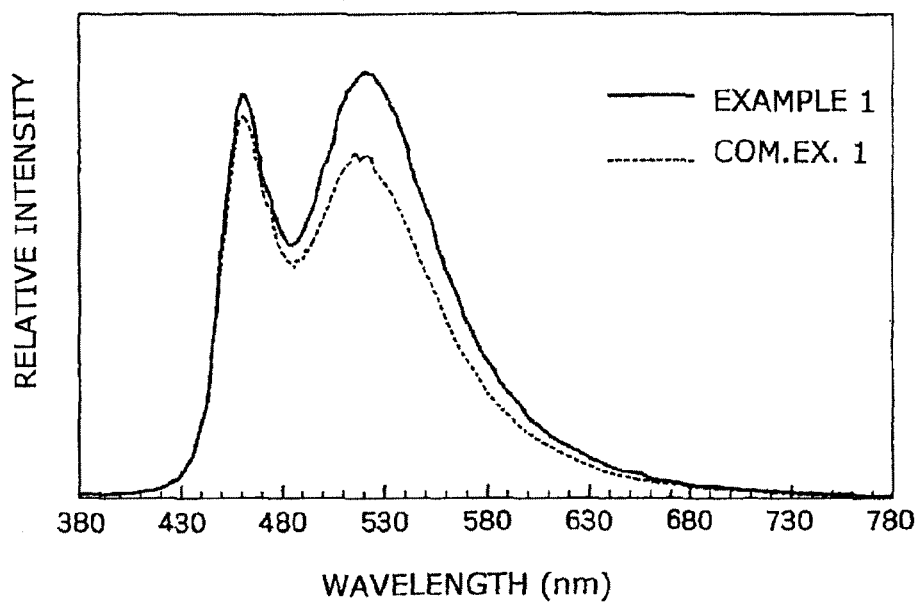
FIG. 8 shows emission spectra given by the fluorescent substances of Example 1 and Comparative Example 1.
Figure 9:
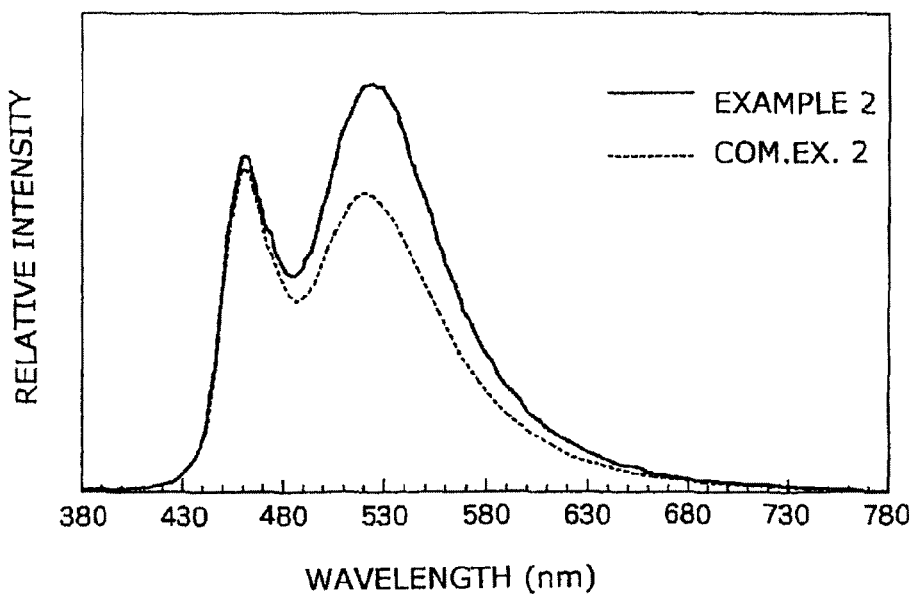
FIG. 9 shows emission spectra given by the fluorescent substances of Example 2 and Comparative Example 2.
Figure 10:
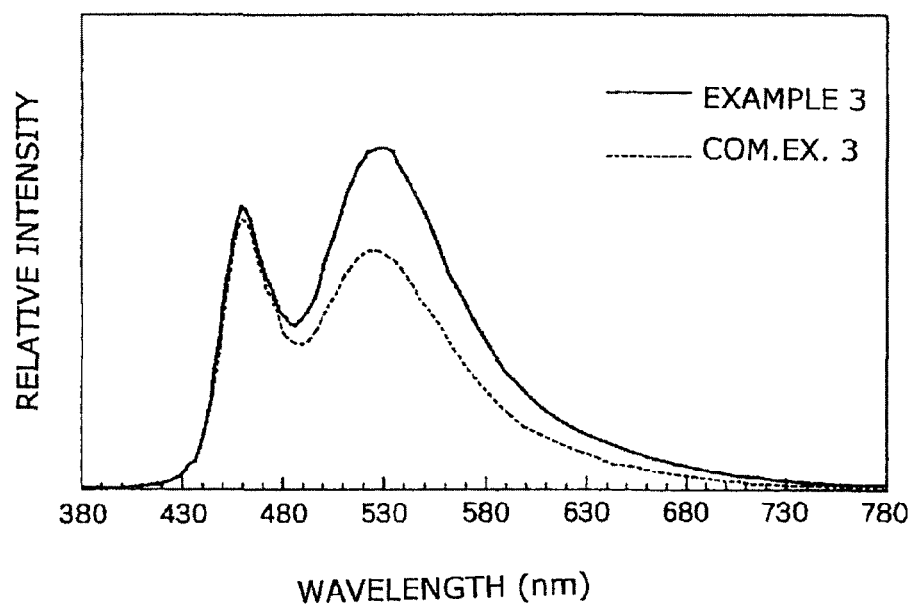
FIG. 10 shows emission spectra given by the fluorescent substances of Example 3 and Comparative Example 3.
Figure 11:
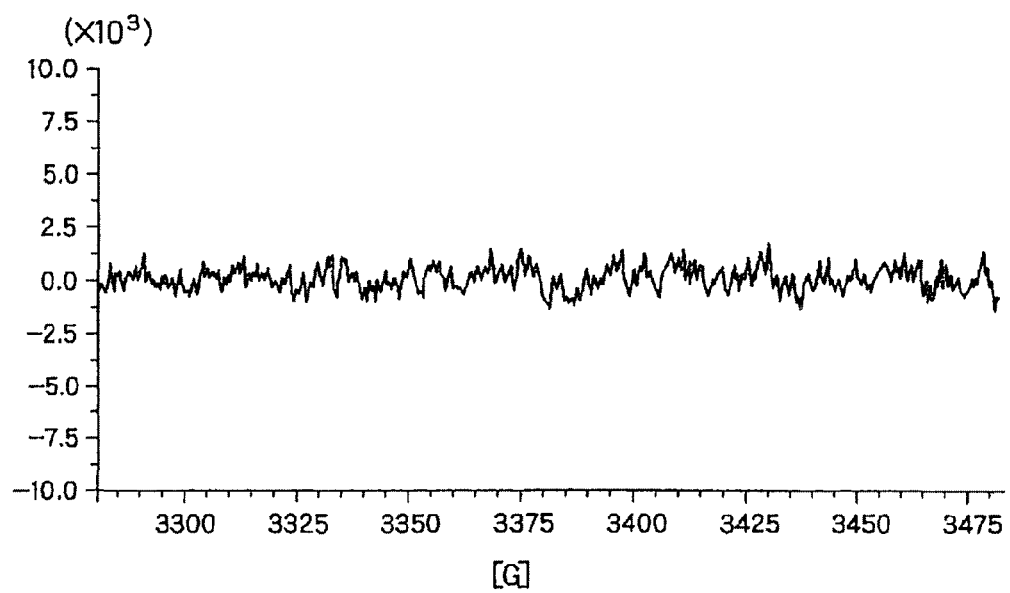
FIG. 11 shows an ESR spectrum given by the fluorescent substance of Example 1.
Figure 12:
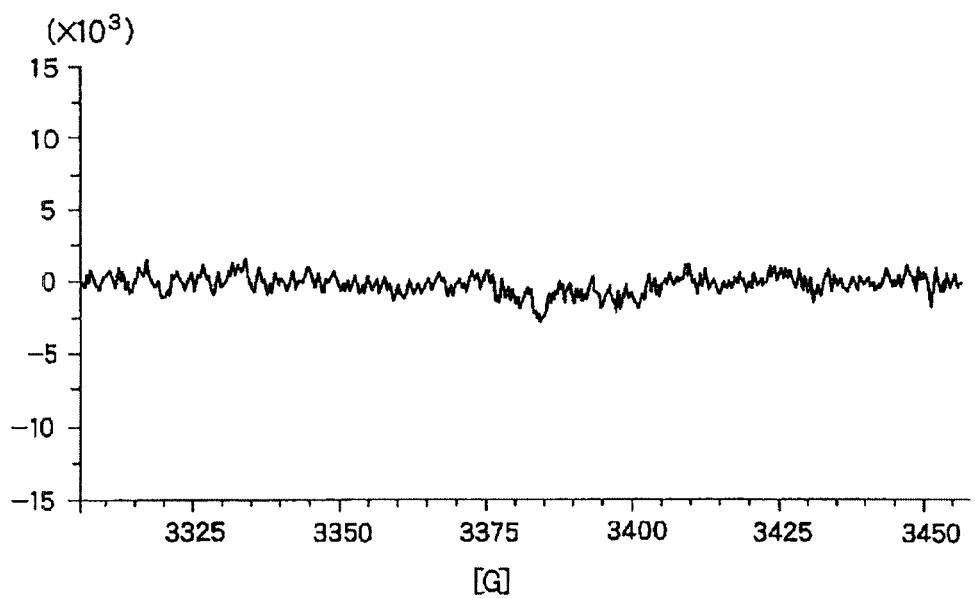
FIG. 12 shows an ESR spectrum given by the fluorescent substance of Example 2.
Figure 13:
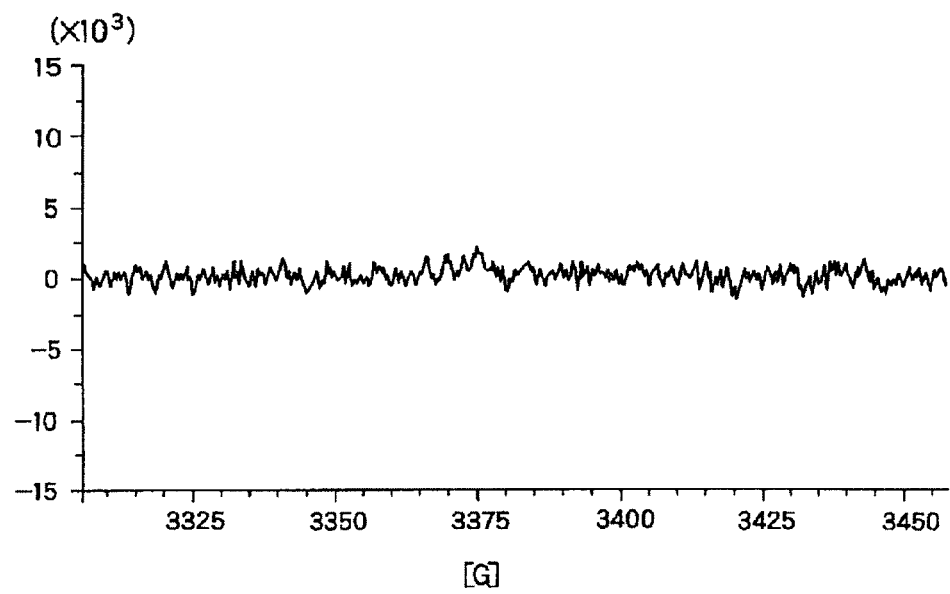
FIG. 13 shows an ESR spectrum given by the fluorescent substance of Example 3.
Figure 14:
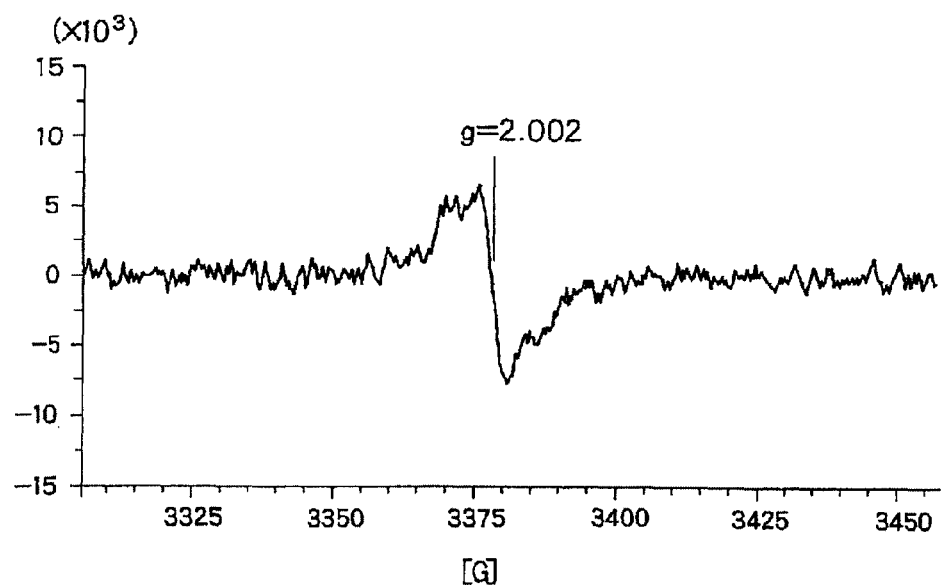
FIG. 14 shows an ESR spectrum given by the fluorescent substance of Comparative Example 1.
Figure 15:
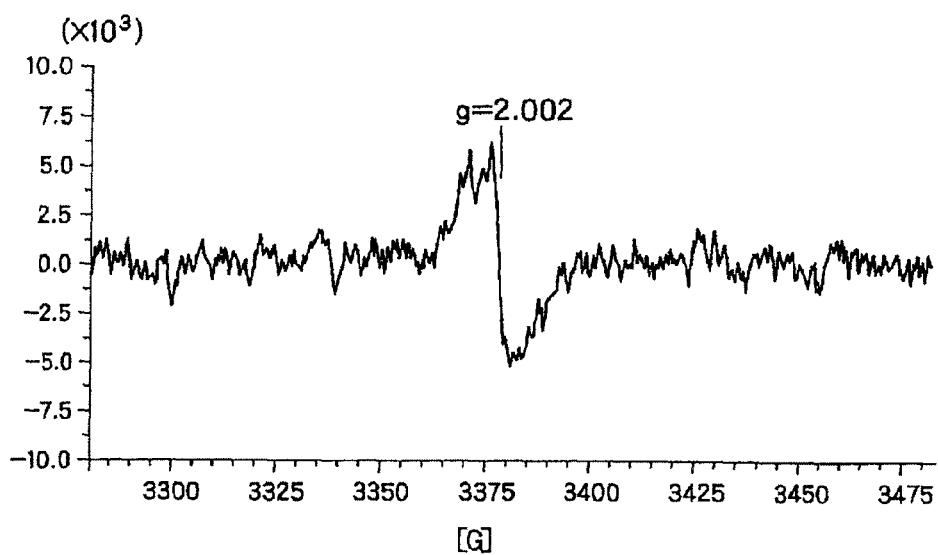
FIG. 15 shows an ESR spectrum given by the fluorescent substance of Comparative Example 2.
Figure 16:
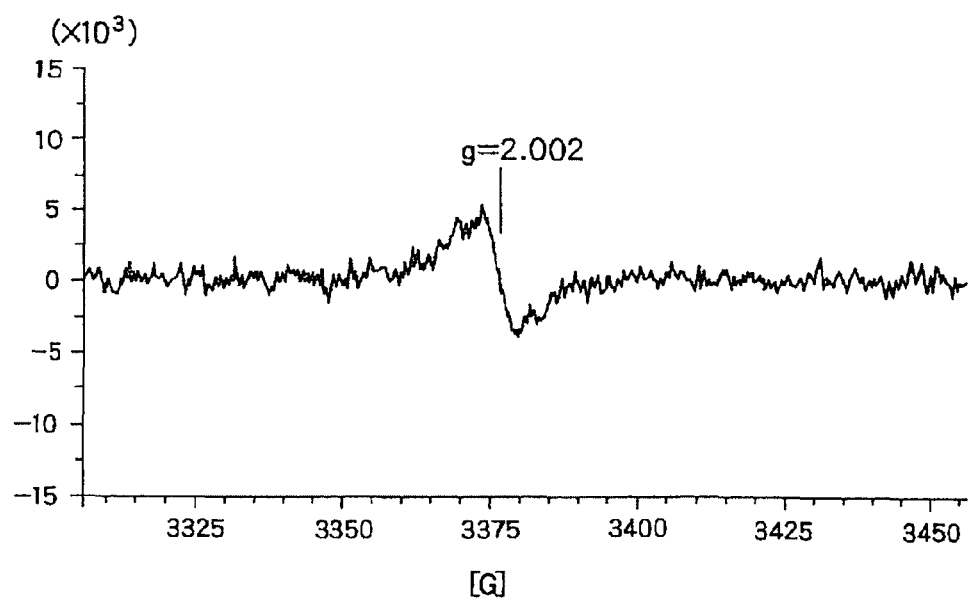
FIG. 16 shows an ESR spectrum given by the fluorescent substance of Comparative Example 3.

FIGS. 8 to 10 show emission spectra given by the fluorescent substances of Examples 1 to 3 and Comparative Examples 1 to 3 under excitation by light at 457 nm. Further, Tables 3 and 4 show emission characteristics and paramagnetic defect densities, respectively, of the fluorescent substances of Examples 1 to 3 and Comparative Examples 1 to 3.

TABLE 3

|  | Wavelength | Emission intensity |
|---|---|---|
| Ex. 1 | 522 nm | 1.26 |
| Com. 1 |  | 1.00 |
| Ex. 2 | 526 nm | 1.23 |
| Com. 2 |  | 0.89 |
| Ex. 3 | 530 nm | 0.95 |
| Com. 3 |  | 0.66 |

The emission intensities in the above table were normalized based on the intensity of Comparative Example at the corresponding wavelength.

TABLE 4

|  | Paramagnetic defect density (spins/g) |
|---|---|
| Ex. 1 | less than $5.0 \times 10^{13}$ |
| Ex. 2 | less than $5.0 \times 10^{13}$ |
| Ex. 3 | less than $5.0 \times 10^{13}$ |
| Com. 1 | $3.7 \times 10^{14}$ |
| Com. 2 | $5.3 \times 10^{14}$ |
| Com. 3 | $3.0 \times 10^{14}$ |

Figure 17:
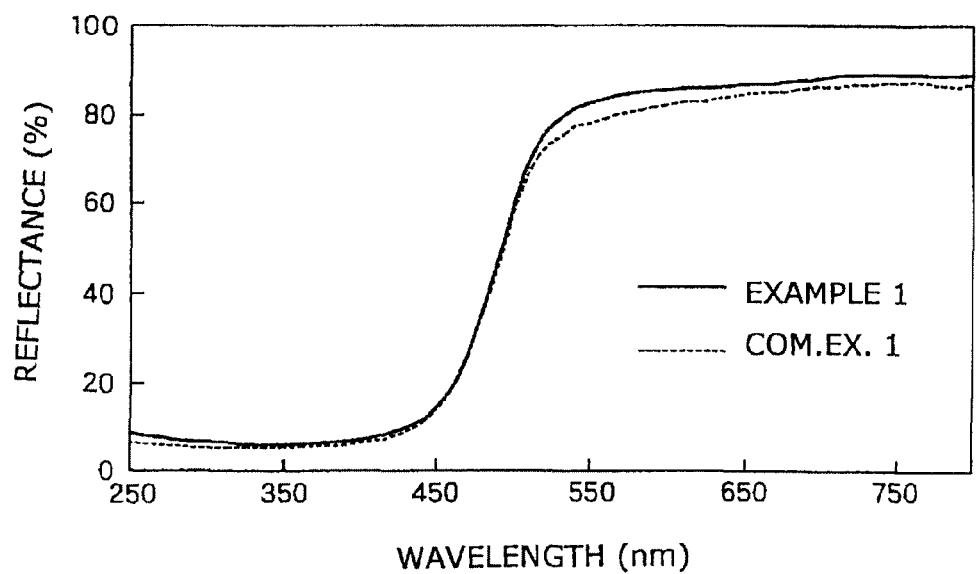
FIG. 17 shows reflection spectra given by the fluorescent substances of Example 1 and Comparative Example 1.

FIG. 17 shows reflection spectra given by the fluorescent substances of Example 1 and Comparative Example 1. The spectrum of Comparative Example 1 exhibited smaller reflectance than that of Example 1 in the range of about 500 to 550 nm, and this indicates that the fluorescent substance absorbs yellowish green luminescence emitted from itself. This absorption by the fluorescent substance itself is presumed to lower the emission intensity of Comparative Example, and is also considered to be attributed to nitrogen defects detected by ESR.

FIGS. 11 to 16 show ESR spectra given by the fluorescent substances of Examples 1 to 3 and Comparative Examples 1 to 3. The fluorescent substances of Examples 1 to 3 had paramagnetic defect densities less than the detection limit ($5.0 \times 10^{13}$ spins/g), but paramagnetic spins of about g=2.0023 were detected in the fluorescent substances of Comparative Examples 1 to 3. Table 3 shows paramagnetic defect densities obtained from the ESR spectra given by the fluorescent substances of Examples 1 to 3 and Comparative Examples 1 to 3. It is presumed that the paramagnetic defects detected in Comparative Examples are attributed to nitrogen defects.

Example 4

As the starting materials, $Sr_3N_2$, EuN, $Si_3N_4$, $Al_2O_3$ and AlN in the amounts of 2.472 g, 0.747 g, 4.911 g, 0.510 g and 1.435 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Sr_{0.85}Eu_{0.15})_2Si_7Al_3ON_{13}$.

The fluorescent substance after the firing procedure was in the form of orange powder, and was observed to emit red luminescence when excited by black light.

The fluorescent substance was then placed in a boron nitride-made crucible equipped with a lid, and thereafter the crucible was encased in a larger boron nitride-made crucible. After the lid was put on the crucible, the fluorescent substance was fired at 1650° C. for 0.5 hour under 1 atm of $N_2/H_2$ atmosphere.

Comparative Example 4

As the starting materials, $Sr_3N_2$, EuN, $Si_3N_4$, $Al_2O_3$ and AlN in the amounts of 2.472 g, 0.747 g, 4.911 g, 0.510 g and 1.435 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Sr_{0.85}Eu_{0.15})_2Si_7Al_3ON_{13}$.

The fluorescent substance after the firing procedure was in the form of orange powder, and was observed to emit red luminescence when excited by black light.

Figure 18:
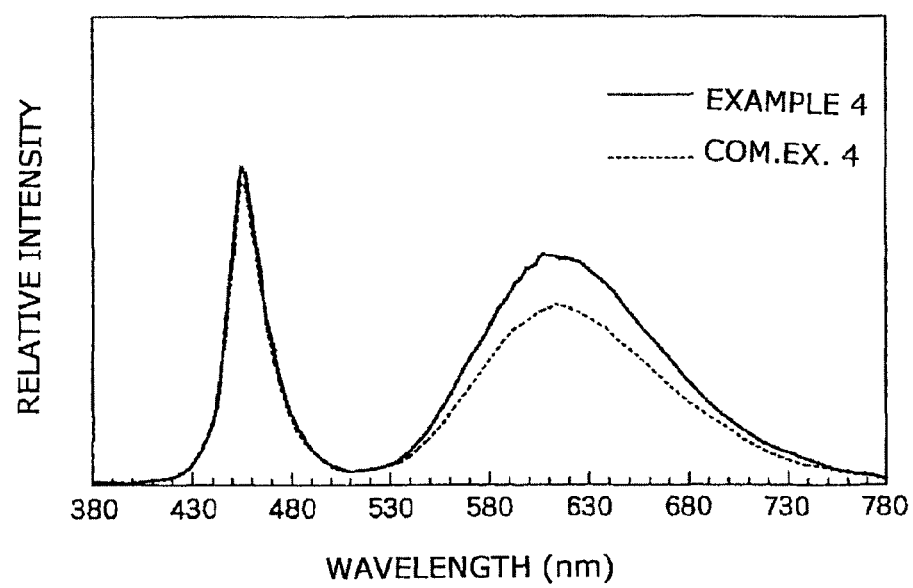
FIG. 18 shows emission spectra given by the fluorescent substances of Example 4 and Comparative Example 4.

FIG. 18 shows emission spectra given by the fluorescent substances of Example 4 and Comparative Example 4 under excitation by light at 457 nm. Further, Table 5 shows emission characteristics of the fluorescent substances of Example 4 and Comparative Example 4.

TABLE 5

| Emission wavelength | Emission intensity (excited at 457 nm) | | Paramagnetic defect density (spins/g)) | |
|---|---|---|---|---|
| (nm) | Ex. 4 | Com. 4 | Ex. 4 | Com. 4 |
| 522 | 1.26 | 1 | less than $5.0 \times 10^{13}$ | $3.7 \times 10^{14}$ |
| 526 | 1.23 | 0.89 | less than $5.0 \times 10^{13}$ | $5.3 \times 10^{14}$ |

TABLE 5-continued

| Emission wavelength | Emission intensity (excited at 457 nm) | | Paramagnetic defect density (spins/g)) | |
|---|---|---|---|---|
| (nm) | Ex. 4 | Com. 4 | Ex. 4 | Com. 4 |
| 530 | 0.95 | 0.66 | less than $5.0 \times 10^{13}$ | $3.0 \times 10^{14}$ |
| 614 | 0.69 | 0.54 | $1 \times 10^{14}$ | $6.7 \times 10^{14}$ |

The emission intensities in the above table were normalized based on the intensity of Comparative Example.

Figure 19:
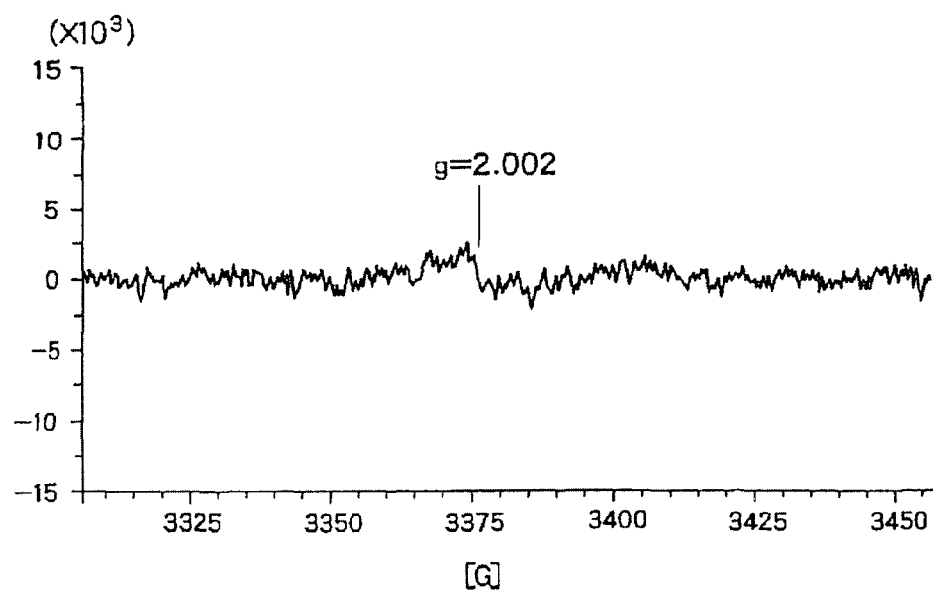
FIG. 19 shows an ESR spectrum given by the fluorescent substance of Example 4.
Figure 20:
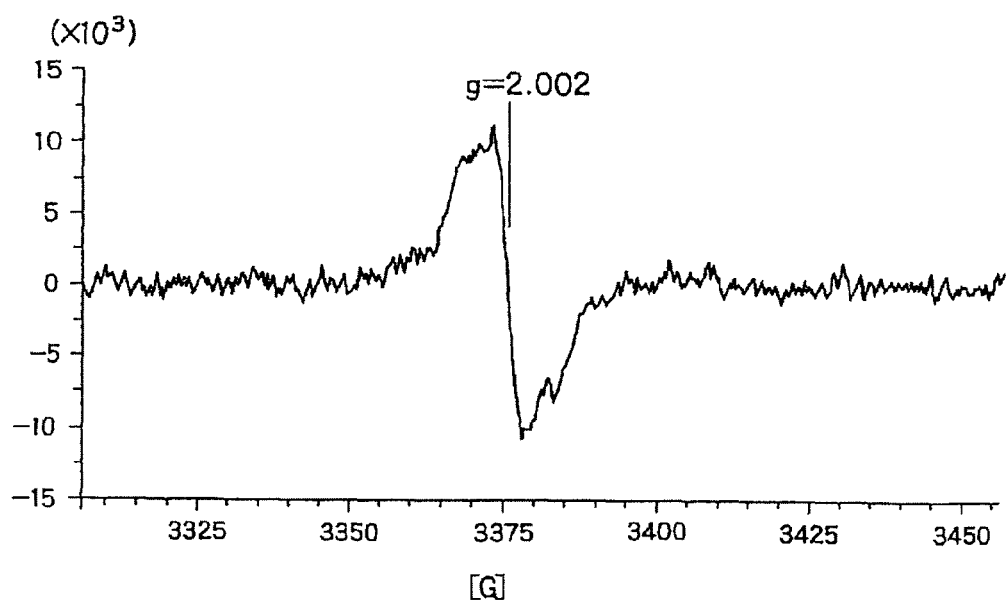
FIG. 20 shows an ESR spectrum given by the fluorescent substance of Comparative Example 4.

FIGS. 19 and 20 show ESR spectra given by the orange powders obtained in Example 4 and Comparative Example 4, respectively. Many paramagnetic defects were detected at about g=2.002 in the orange powder of Comparative Example 4, but paramagnetic defects in a small amount were detected in that of Example 4. Table 5 also shows paramagnetic defect densities obtained from the ESR spectra given by the orange powders of Example 4 and Comparative Example 4. It is presumed that the paramagnetic defects detected in Comparative Example 4 are attributed to nitrogen defects.

Example 5

As the starting materials, $SrCO_3$, $Eu_2O_3$, $Si_3N_4$ and AlN in the amounts of 0.664 g, 0.792 g, 3.788 g and 7.009 g, respectively, were weighed out and then dry-mixed in an agate mortar. The mixture was placed in a boron nitride-made crucible and then fired at 1800° C. for 4 hours under 7 atm of $N_2$ atmosphere, to synthesize a fluorescent substance whose designed composition was $(Sr_{0.5}Eu_{0.5})Si_9Al_{19}ON_{31}$.

The fluorescent substance after the firing procedure was in the form of pale green powder, and was observed to emit blue luminescence when excited by black light.

The fluorescent substance was then placed in a boron nitride-made crucible equipped with a lid, and thereafter the crucible was encased in a larger boron nitride-made crucible. After the lid was put on the crucible, the fluorescent substance was fired at 1650° C. for 0.5 hour under 1 atm of $N_2/H_2$ atmosphere.

Comparative Example 5

As the starting materials, $SrCO_3$, $Eu_2O_3$, $Si_3N_4$ and AlN in the amounts of 0.664 g, 0.792 g, 3.788 g and 7.009 g, respectively, were weighed out and then dry-mixed in an agate mortar. The mixture was placed in a boron nitride-made crucible and then fired at 1800° C. for 4 hours under 7 atm of $N_2$ atmosphere, to synthesize a fluorescent substance whose designed composition was $(Sr_{0.5}Eu_{0.5})Si_9Al_{19}ON_{31}$.

The fluorescent substance after the firing procedure was in the form of pale green powder, and was observed to emit blue luminescence when excited by black light.

Example 6

As the starting materials, $SrCO_3$, $Eu_2O_3$, $Si_3N_4$ and AlN in the amounts of 0.332 g, 1.188 g, 3.788 g and 7.009 g, respectively, were weighed out and then dry-mixed in an agate mortar. The mixture was placed in a boron nitride-made crucible and then fired at 1800° C. for 4 hours under 7 atm of $N_2$ atmosphere, to synthesize a fluorescent substance whose designed composition was $(Sr_{0.25}Eu_{0.75})Si_9Al_{19}ON_{31}$.

The fluorescent substance after the firing procedure was in the form of pale green powder, and was observed to emit blue luminescence when excited by black light.

The fluorescent substance was then placed in a boron nitride-made crucible equipped with a lid, and thereafter the crucible was encased in a larger boron nitride-made crucible. After the lid was put on the crucible, the fluorescent substance was fired at 1650° C. for 0.5 hour under 1 atm of $N_2/H_2$ atmosphere.

Comparative Example 6

As the starting materials, $SrCO_3$, $Eu_2O_3$, $Si_3N_4$ and AlN in the amounts of 0.332 g, 1.188 g, 3.788 g and 7.009 g, respectively, were weighed out and then dry-mixed in an agate mortar. The mixture was placed in a boron nitride-made crucible and then fired at 1800° C. for 4 hours under 7 atm of $N_2$ atmosphere, to synthesize a fluorescent substance whose designed composition was $(Sr_{0.25}Eu_{0.75})Si_9Al_{19}ON_{31}$.

The fluorescent substance after the firing procedure was in the form of pale green powder, and was observed to emit blue luminescence when excited by black light.

Example 7

As the starting materials, $Eu_2O_3$, $Si_3N_4$ and AlN in the amounts of 1.584 g, 3.788 g and 7.009 g, respectively, were weighed out and then dry-mixed in an agate mortar. The mixture was placed in a boron nitride-made crucible and then fired at 1800° C. for 4 hours under 7 atm of $N_2$ atmosphere, to synthesize a fluorescent substance whose designed composition was $EuSi_9Al_{19}ON_{31}$.

The fluorescent substance after the firing procedure was in the form of pale green powder, and was observed to emit blue luminescence when excited by black light.

The fluorescent substance was then placed in a boron nitride-made crucible equipped with a lid, and thereafter the crucible was encased in a larger boron nitride-made crucible. After the lid was put on the crucible, the fluorescent substance was fired at 1650° C. for 0.5 hour under 1 atm of $N_2/H_2$ atmosphere.

Comparative Example 7

As the starting materials, $Eu_2O_3$, $Si_3N_4$ and AlN in the amounts of 1.584 g, 3.788 g and 7.009 g, respectively, were weighed out and then dry-mixed in an agate mortar. The mixture was placed in a boron nitride-made crucible and then fired at 1800° C. for 4 hours under 7 atm of $N_2$ atmosphere, to synthesize a fluorescent substance whose designed composition was $EuSi_9Al_{19}ON_{31}$.

The fluorescent substance after the firing procedure was in the form of pale green powder, and was observed to emit blue luminescence when excited by black light.

Figure 21:
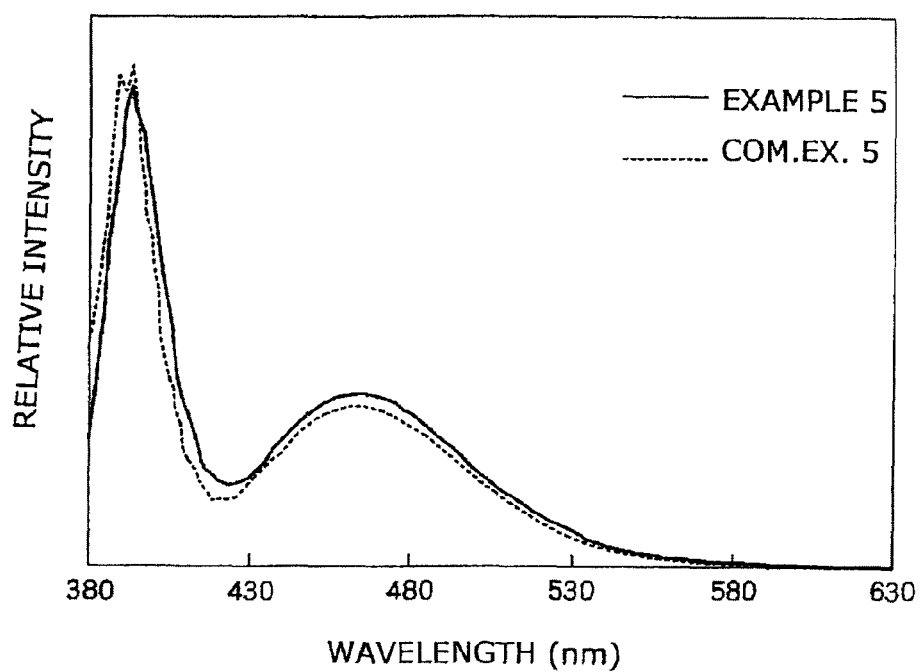
FIG. 21 shows emission spectra given by the fluorescent substances of Example 5 and Comparative Example 5.
Figure 22:
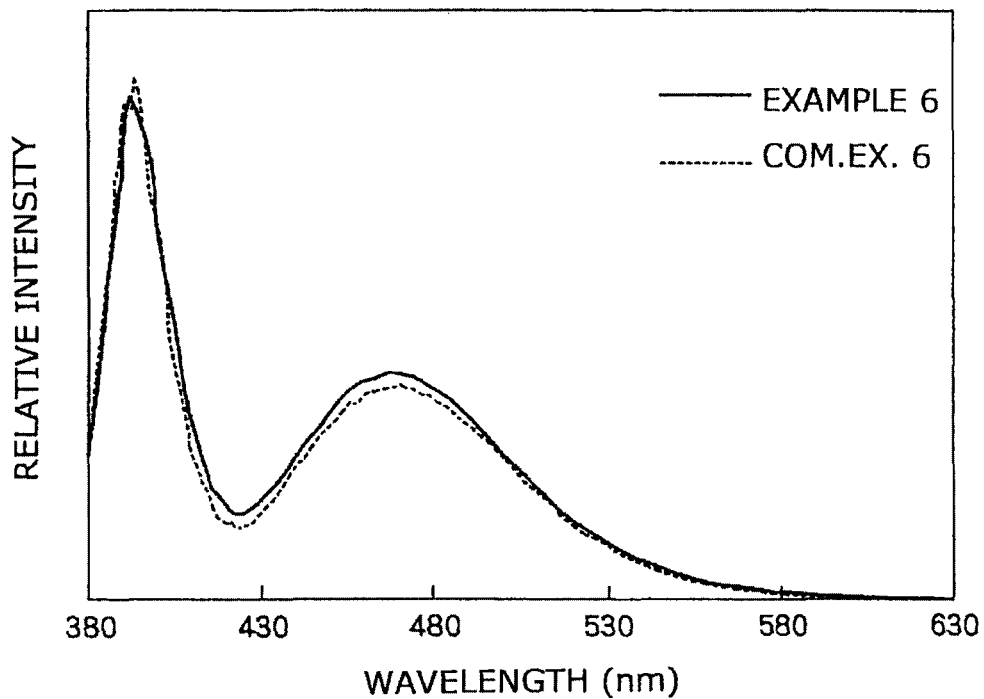
FIG. 22 shows emission spectra given by the fluorescent substances of Example 6 and Comparative Example 6.
Figure 23:
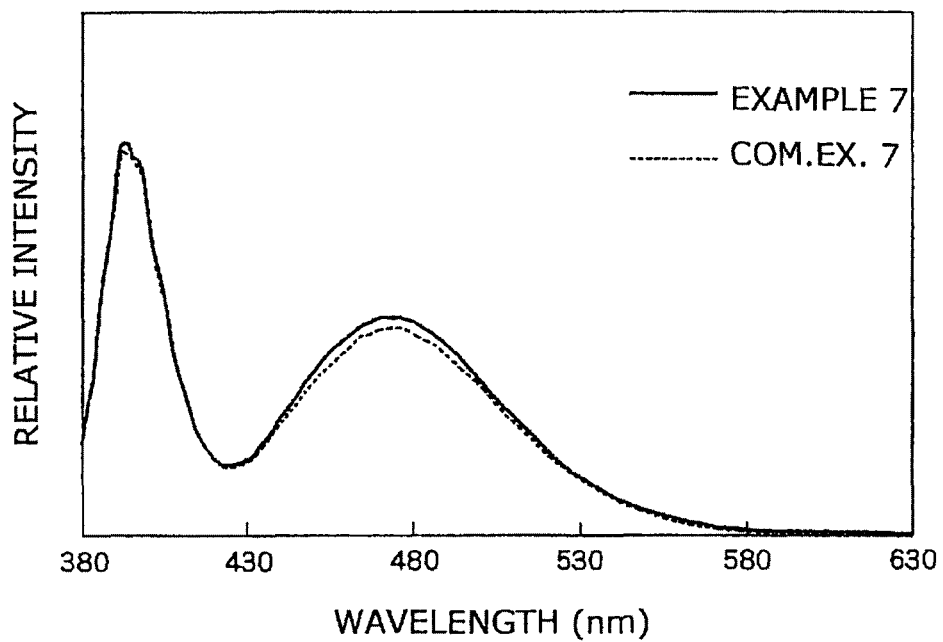
FIG. 23 shows emission spectra given by the fluorescent substances of Example 7 and Comparative Example 7.

FIGS. 21 to 23 show emission spectra given by the fluorescent substances of Examples 5 to 7 and Comparative Examples 5 to 7 under excitation by light at 392 nm.

Example 8

As the starting materials, $Ca_3N_2$, EuN, $Si_3N_4$ and AlN in the amounts of 3.744 g, 0.204 g, 2.869 g and 3.274 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Ca_{0.984}Eu_{0.016})SiAlN_3$.

The fluorescent substance after the firing procedure was in the form of red powder, and was observed to emit red luminescence when excited by black light.

The fluorescent substance was then placed in a boron nitride-made crucible equipped with a lid, and thereafter the crucible was encased in a larger boron nitride-made crucible. After the lid was put on the crucible, the fluorescent substance was fired at 1500° C. for 12 hours under 1 atm of $N_2/H_2$ atmosphere.

Comparative Example 8

As the starting materials, $Ca_3N_2$, EuN, $Si_3N_4$ and AlN in the amounts of 3.744 g, 0.204 g, 2.869 g and 3.274 g, respectively, were weighed out in a vacuum glove box filled with Ar, and then dry-mixed in an agate mortar. The mixture was placed in a boron nitride-made crucible and then fired at 1850° C. for 4 hours under 7.5 atm of $N_2$ atmosphere, to synthesize a fluorescent substance whose designed composition was $(Ca_{0.984}Eu_{0.016})SiAlN_3$.

The fluorescent substance after the firing procedure was in the form of red powder, and was observed to emit red luminescence when excited by black light.

Figure 24:
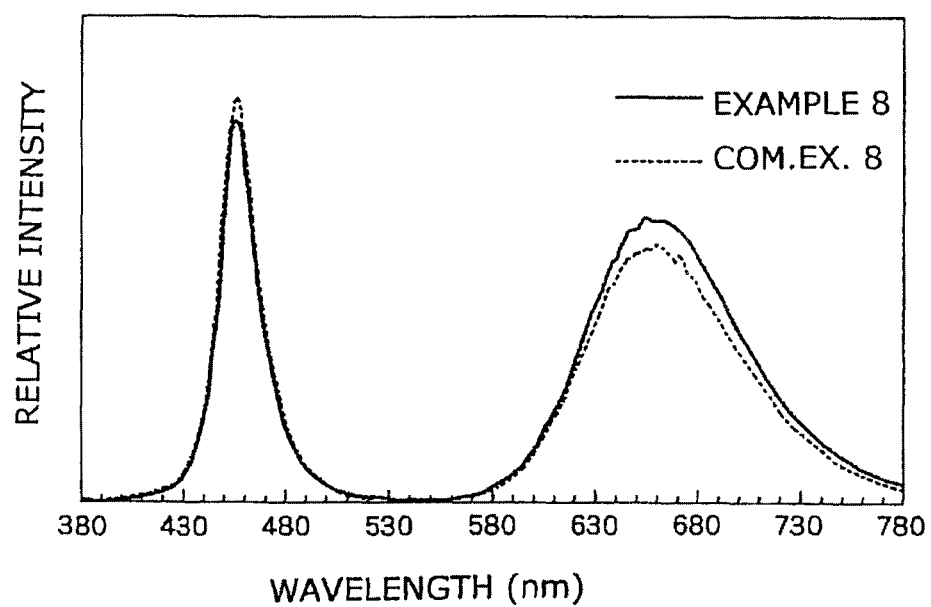
FIG. 24 shows emission spectra given by the fluorescent substances of Example 8 and Comparative Example 8.

FIG. 24 shows emission spectra given by the fluorescent substances of Example 8 and Comparative Example 8 under excitation by light at 455 nm. When excited by light at 455 nm, the fluorescent substance of Example 8 exhibited 1.10 times as large emission intensity at 660 nm as that of Comparative Example 8.

BRIEF DESCRIPTION OF THE NUMERALS

100: resin system
101: lead
102: lead
103: resin member
104: reflective surface
105: concavity
106: light-emitting chip
107: bonding wire
108: bonding wire
109: phosphor layer
110: fluorescent substance
111: resin layer
301: Sr
302: Si or Al
303: O or N

The invention claimed is:

1. An oxynitride phosphor comprising aluminum, silicon, oxygen, nitrogen, and a metal element M selected from the group consisting of IA group elements, IIA group elements, IIIA group elements other than aluminum, IIIB group elements, rare earth elements and IVA group elements other than silicon, provided that said metal element M is partly replaced with an emission center element R selected from the group consisting of Eu, Ce, Mn, Tb, Yb, Dy, Sm, Tm, Pr, Nd, Pm, Ho, Er, Cr, Sn, Cu, Zn, As, Ag, Cd, Sb, Au, Hg, Tl, Pb, Bi and Fe;

wherein the oxynitride phosphor has a paramagnetic defect density detected at g=2.002 in an electron spin resonance measurement of less than $2 \times 10^{14}$ spins/g, wherein the oxynitride phosphor is represented by the following formula (3):

$$(M'_{1-x3}R_{x3})Si_{10-p}Al_{18+p}O_pN_{32-p} \qquad (3),$$

wherein M' is an element selected from the group consisting of IIA group metals and rare earth metals; R is the emission center element R and x3 and p are numbers satisfying the conditions of 0<x3≤1 and 0<p≤10, respectively;

has an AlN polytypoid structure; and emits luminescence having a peak in a wavelength range of from 400 to 700 nm when excited by electron energy or light in a wavelength range of from 250 to 500 nm.

2. A process for producing the oxynitride phosphor of claim 1, comprising:

first firing in which a mixture of starting materials is subjected to heat treatment under a nitrogen atmosphere, thereby obtaining an intermediate fired product, and second firing in which said intermediate fired product is subjected to heat treatment under an atmosphere of nitrogen-hydrogen mixed gas comprising from 1% to less than 100% by volume of hydrogen, thereby forming the oxynitride phosphor.

3. The oxynitride phosphor of claim 1, wherein M is one metal element selected from the group consisting of Li, Na, K, Mg, Ca, Sr, Ba, B, Ga, In, Y, Sc, Gd, La, Lu and Ge.

4. The oxynitride phosphor of claim 1, wherein R is Eu.

5. The oxynitride phosphor of claim 1, wherein R is Mn.

6. The oxynitride phosphor of claim 1, wherein 0.1 mol % to less than 50 mol % of M is replaced by R.

7. The oxynitride phosphor of claim 1, wherein the paramagnetic defect density detected at g=2.002 in electron spin resonance measurement is less than $5 \times 10^{13}$ spins/g.

* * * * *